US012777790B2

(12) United States Patent
Chen et al.

(10) Patent No.: US 12,777,790 B2
(45) Date of Patent: Oct. 27, 2026

(54) DISPLAY PANEL AND DISPLAY DEVICE INCLUDING EDGE GROUND TRACES AND ANTENNA PROJECTION REGION

(71) Applicants: Chengdu BOE Optoelectronics Technology Co., Ltd., Chengdu (CN); BOE Technology Group Co., Ltd., Beijing (CN)

(72) Inventors: Tianci Chen, Beijing (CN); Hongwei Ma, Beijing (CN); Chang Luo, Beijing (CN); Yi Zhang, Beijing (CN); Siyu Wang, Beijing (CN); Ping Wen, Beijing (CN); Wei Wang, Beijing (CN); Yu Wang, Beijing (CN); Junxiu Dai, Beijing (CN); Yang Zeng, Beijing (CN); Liheng Wei, Beijing (CN)

(73) Assignees: Chengdu BOE Optoelectronics Technology Co., Ltd., Chengdu (CN); Beijing BOE Technology Development Co., Ltd., Beijing (CN)

( * ) Notice: Subject to any disclaimer, the term of this patent is extended or adjusted under 35 U.S.C. 154(b) by 511 days.

(21) Appl. No.: 18/279,394

(22) PCT Filed: Oct. 28, 2022

(86) PCT No.: PCT/CN2022/128320
§ 371 (c)(1),
(2) Date: Aug. 30, 2023

(87) PCT Pub. No.: WO2024/087180
PCT Pub. Date: May 2, 2024

(65) Prior Publication Data

US 2025/0089486 A1 Mar. 13, 2025

(51) Int. Cl.
*H10K 59/13* (2023.01)
*H10K 59/131* (2023.01)
(Continued)

(52) U.S. Cl.
CPC ........... *H10K 59/131* (2023.02); *H10K 59/40* (2023.02); *H10K 50/844* (2023.02); *H10K 59/12* (2023.02); *H10K 59/124* (2023.02)

(58) Field of Classification Search
CPC ...... H10K 59/131; H10K 59/40; H10K 59/12; H10K 59/124; H10K 50/844; H10D 86/00; G06F 3/041
See application file for complete search history.

(56) References Cited

U.S. PATENT DOCUMENTS

2010/0110601 A1 5/2010 Yang et al.
2013/0113711 A1 5/2013 Nien et al.
(Continued)

FOREIGN PATENT DOCUMENTS

CN 101741929 A 6/2010
CN 103092397 A 5/2013
(Continued)

*Primary Examiner* — Ida M Soward

(57) ABSTRACT

A display panel includes an active region and an edge region located on at least one side of the active region. The edge region includes an antenna projection region and a non-antenna projection region located at least one side of the antenna projection region. The active region includes a base substrate, and a display structure layer and a touch structure layer arranged on the base substrate sequentially. The edge region includes isolation dams and edge ground traces arranged on the base substrate. The edge ground traces are located on a side of the isolation dam away from the active region. An overlapping area between the edge ground traces and the antenna projection region is smaller than an overlapping area between the edge ground traces and the non-antenna projection region.

20 Claims, 12 Drawing Sheets

(51) Int. Cl.

| | |
|---|---|
| ***H10K 59/40*** | (2023.01) |
| *H10K 50/844* | (2023.01) |
| *H10K 59/12* | (2023.01) |
| *H10K 59/124* | (2023.01) |

(56) References Cited

U.S. PATENT DOCUMENTS

| | | | | |
|---|---|---|---|---|
| 2020/0393936 | A1* | 12/2020 | Bok | G06F 3/0448 |
| 2023/0163456 | A1 | 5/2023 | Choi et al. | |
| 2023/0238495 | A1* | 7/2023 | Choi | H01L 25/0753<br>257/79 |

FOREIGN PATENT DOCUMENTS

| | | | | | |
|---|---|---|---|---|---|
| CN | 104571692 | A | | 4/2015 | |
| CN | 206879291 | U | | 1/2018 | |
| CN | 112083826 | A | | 12/2020 | |
| CN | 112612323 | A | | 4/2021 | |
| CN | 113311964 | A | | 8/2021 | |
| CN | 113690276 | A | | 11/2021 | |
| CN | 113972484 | A | | 1/2022 | |
| CN | 111880344 | B | * | 6/2022 | G02F 1/13458 |
| CN | 216979737 | U | * | 7/2022 | |
| KR | 20170093869 | A | * | 8/2017 | H10P 74/273 |
| KR | 20190069226 | A | * | 6/2019 | H10K 59/131 |
| WO | 2022199444 | A1 | | 9/2022 | |

* cited by examiner

DISPLAY PANEL AND DISPLAY DEVICE INCLUDING EDGE GROUND TRACES AND ANTENNA PROJECTION REGION

CROSS-REFERENCE TO RELATED APPLICATIONS

The present application is a U.S. National Phase Entry of International Application PCT/CN2022/128320 having an international filing date of Oct. 28, 2022, and entitled "Display Panel and Display Device", the contents of which should be regarded as being incorporated herein by reference.

TECHNICAL FIELD

The present disclosure relates to, but is not limited to, the field of display technology, in particular to a display panel and a display device.

BACKGROUND

With development of portable electronic display devices, a new man-machine interaction interface is provided by a touch technology, which is more direct and more humanized in use. The touch technology is integrated with flat display technology to form a display touch device, enabling a flat display device to have a touch function.

SUMMARY

The following is a summary of subject matter described herein in detail. The summary is not intended to limit the protection scope of claims.

An embodiment of the present disclosure provides a display panel and a display device.

In one aspect, an embodiment provides a display panel, including an active region and an edge region located on at least one side of the active region, wherein the edge region includes an antenna projection region and a non-antenna projection region located on at least one side of the antenna projection region. The active region includes a base substrate, and a display structure layer and a touch structure layer arranged sequentially on the base substrate. The edge region includes an isolation dam and edge ground traces arranged on the base substrate. The edge ground traces are located on a side of the isolation dam far away from the active region. An overlapping area between the edge ground traces and the antenna projection region is smaller than an overlapping area between the edge ground traces and the non-antenna projection region.

In some exemplary implementations, a proportion of the overlapping area between the edge ground traces and the antenna projection region in the antenna projection region is less than or equal to 7%.

In some exemplary implementations, a portion of the edge ground traces located on a side of the antenna projection region close to the active region are first traces, and a portion of the edge ground traces located on a side of the non-antenna projection region close to the active region are second traces. A distance between an edge of a side of the first traces close to the active region and an edge of the base substrate is greater than a distance between an edge of a side of the second traces close to the active region and the edge of the base substrate.

In some exemplary implementations, the edge ground traces include an outer ring trace, an inner ring trace, and a plurality of first connection traces; the plurality of first connection traces are connected to the inner ring trace and the outer ring trace; the outer ring trace is located on a side of the inner ring trace away from the active region; and the plurality of first connection traces are located in the non-antenna projection region.

In some exemplary implementations, the inner ring trace includes at least two inner ring trace segments and an inner ring connection segment connected to adjacent inner ring trace segments; and a distance between the inner ring connection segment and the edge of the base substrate is larger than a distance between an inner ring trace segment and the edge of the base substrate.

In some exemplary implementations, the inner ring trace is not overlapped with the antenna projection region, and the inner ring connection segment of the inner ring trace is located on a side of the antenna projection region close to the active region.

In some exemplary implementations, the inner ring trace is provided with a plurality of first openings, which are arranged in at least one column along a direction from the active region towards the edge region.

In some exemplary implementations, the outer ring trace is not overlapped with the antenna projection region, and the outer ring trace at least includes two outer ring trace segments located in the non-antenna projection region.

In some exemplary implementations, the outer ring trace includes at least two outer ring trace segments and an outer ring connection segment connected to adjacent outer ring trace segments; and the at least two outer ring trace segments are located in the non-antenna projection region. A distance between the outer ring connection segment and the edge of the base substrate is larger than a distance between an outer ring trace segment and the edge of the base substrate.

In some exemplary implementations, a width of the outer ring connection segment of the outer ring trace is less than a width of the outer ring trace segment.

In some exemplary implementations, a width of the outer ring connection segment of the outer ring trace is substantially the same as a width of the inner ring connection segment of the inner ring trace.

In some exemplary implementations, the outer ring connection segment of the outer ring trace is located on a side of the antenna projection region close to the inner ring trace.

In some exemplary implementations, the outer ring connection segment is provided with a plurality of second openings, which are arranged in at least one column along a direction from the active region towards the edge region.

In some exemplary implementations, the outer ring connection segment of the outer ring trace is at least partially overlapped with the antenna projection region.

In some exemplary implementations, the outer ring trace further includes a plurality of outer ring extension segments, which are connected to a side of the outer ring connection segment close to the edge of the base substrate, respectively, and extend to the edge of the base substrate; and the plurality of outer ring extension segments are at least partially overlapped with the antenna projection region.

In some exemplary implementations, an orthographic projection of at least one of the plurality of outer ring extension segments on the base substrate is rectangular or T-shaped.

In some exemplary implementations, the outer ring trace further includes: at least one second connection trace; the outer ring connection segment of the outer ring trace is connected to the inner ring connection segment of the inner ring trace through the at least one second connection trace;

and a resistance of a second connection trace is substantially the same as that of a first connection trace.

In some exemplary implementations, an orthographic projection of each of the first connection traces and the second connection traces on the base substrate is a zigzag trace.

In some exemplary implementations, a plurality of anti-static capacitors are arranged between the outer ring trace segments of the outer ring trace and the inner ring trace segments of the adjacent inner ring trace, and at least one anti-static capacitor includes a first plate and a second plate, wherein the first plate and the outer ring trace segments are of an integral structure, and the second plate is located on a side of the first plate close to the inner ring trace segments.

In some exemplary implementations, the first plate has a plurality of first comb portions facing the second plate, and the second plate has a plurality of second comb portions facing the first plate, and the plurality of first comb portions and the plurality of second comb portions are interspersed with each other.

In some exemplary implementations, the first plate of the at least one anti-static capacitor is grounded and the second plate is a dummy conductive structure.

In some exemplary implementations, the touch structure layer includes at least one touch conductive layer and a second touch insulation layer located on a side of the at least one touch conductive layer away from the base substrate, and an edge of the second touch insulation layer is overlapped with the anti-static capacitors.

In some exemplary implementations, the touch structure layer includes at least one touch conductive layer; and the edge ground traces and the touch conductive layer are disposed in a same layer.

In some exemplary implementations, the at least one touch conductive layer includes touch traces, and the edge ground traces are located on a side of the touch traces away from the active region.

In some exemplary implementations, the touch structure layer includes a first touch conductive layer, a second touch conductive layer, and a first touch insulation layer located between the first touch conductive layer and the second touch conductive layer, and a boundary of the first touch insulation layer is located on a side of the edge ground traces close to the active region.

In some exemplary implementations, an edge of the base substrate is flush with an edge of the edge ground traces in the edge region.

In another aspect, embodiments of the present disclosure provide a display device including the display panel as described above and an antenna structure, wherein the antenna structure is located on a side of a base substrate of the display panel away from the touch structure layer, and an antenna projection region of the display panel is overlapped with an orthographic projection of the antenna structure on the display panel.

In another aspect, an embodiment of the present disclosure provides a display device including a display panel and an antenna structure. The display panel includes an active region and an edge region located on at least one side of the active region, wherein the edge region includes an antenna projection region and a non-antenna projection region located on at least one side of the antenna projection region. The active region of the display panel includes a base substrate, and a display structure layer and a touch structure layer arranged sequentially on the base substrate. The edge region of the display panel includes touch leads and edge ground traces which are arranged on the base substrate, wherein the edge ground traces are located on a side of the touch lead away from the active region. The touch leads and the edge ground traces are at least partially arranged on a same layer. An orthographic projection of the antenna structure on the display panel is overlapped with the antenna projection region of the display panel. An overlapping area between the edge ground traces and the antenna projection region is smaller than an overlapping area between the edge ground traces and the non-antenna projection region.

In some exemplary implementations, the antenna structure is located on a side of the base substrate of the display panel away from the touch structure layer.

In some exemplary implementations, a portion of the edge ground traces located on a side of the antenna projection region close to the active region are first traces, and a portion of the edge ground traces located on a side of the non-antenna projection region close to the active region are second traces; and a distance between an edge of a side of the first traces close to the active region and an edge of the base substrate is greater than a distance between an edge of a side of the second traces close to the active region and the edge of the base substrate.

Other aspects may be understood upon reading and understanding of the drawings and detailed description.

BRIEF DESCRIPTION OF DRAWINGS

Accompanying drawings are used to provide an understanding of technical solutions of the present disclosure, form a part of the specification, and are used to explain the technical solutions of the present disclosure together with embodiments of the present disclosure but are not intended to form limitations on the technical solutions of the present disclosure. Shapes and sizes of one or more components in the drawings do not reflect actual scales, and are only intended to schematically describe contents of the present disclosure.

DETAILED DESCRIPTION

Figure 1A:
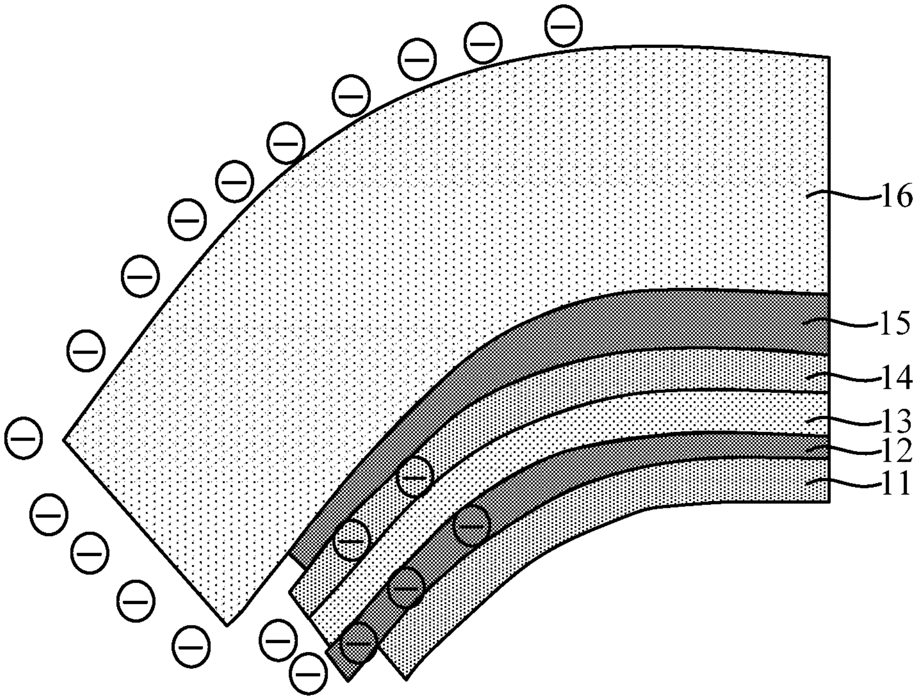
FIG. 1A is a schematic diagram showing conduction of negative charges generated by friction on a surface of a cover plate of a display panel.

The embodiments of the present disclosure will be described below with reference to the drawings in detail. Implementations may be practiced in a plurality of different forms. Those of ordinary skills in the art may easily understand such a fact that implementations and contents may be transformed into one or more forms without departing from the purpose and scope of the present disclosure. Therefore, the present disclosure should not be explained as being limited to contents described in following implementations only. The embodiments in the present disclosure and features in the embodiments may be combined randomly with each other if there is no conflict.

In the drawings, a size of one or more constituent elements, a thickness of a layer, or a region is sometimes exaggerated for clarity. Therefore, one implementation of the present disclosure is not necessarily limited to the dimensions, and shapes and sizes of various components in the drawings do not reflect actual scales. In addition, the drawings schematically illustrate ideal examples, and one implementation of the present disclosure is not limited to shapes, numerical values, or the like shown in the drawings.

Ordinal numerals such as "first", "second" and "third" in the present disclosure are set to avoid confusion between constituent elements, but not intended for restriction in quantity. In the present disclosure, "a plurality/multiple" represents two or more than two.

In the present disclosure, for convenience, wordings "central", "up", "down", "front", "back", "vertical", "horizontal", "top", "bottom", "inside", "outside" and the like indicating orientation or positional relationships are used to illustrate positional relationships between constituent elements with reference to the drawings, which are only used to facilitate describing the present specification and simplify the description, rather than indicating or implying that involved devices or elements must have specific orientations and be structured and operated in the specific orientations, and thus should not be understood as limitations on the present disclosure. The positional relationships between the constituent elements are changed as appropriate based on directions for describing the constituent elements. Therefore, appropriate replacements may be made according to situations without being limited to the wordings described in the specification.

In the present disclosure, unless otherwise specified and defined, terms "mount", "mutual connection" and "connect" should be understood in a broad sense. For example, a connection may be a fixed connection, or a detachable connection, or an integrated connection. It may be a mechanical connection or an electrical connection. It may be a direct mutual connection, or an indirect connection through a middleware, or an internal communication between two elements. Those of ordinary skills in the art may understand meanings of the above-mentioned terms in the present disclosure according to situations. Among them, an "electrical connection" includes a case where constituent elements are connected together through an element with a certain electrical effect. The "element with the certain electrical effect" is not particularly limited as long as electrical signals between the connected constituent elements may be transmitted. Examples of the "element with the certain electrical effect" not only include electrodes and wirings, but also include switching elements such as transistors, resistors, inductors, capacitors, and other elements with one or more functions, etc.

In the present disclosure, a transistor refers to an element including at least three terminals, namely, a gate electrode, a drain electrode and a source electrode. The transistor has a channel region between the drain electrode (drain electrode terminal, drain region, or drain) and the source electrode (source electrode terminal, source region, or source), and a current can flow through the drain electrode, the channel region and the source electrode. In the present disclosure, the channel region refers to a region through which the current mainly flows.

In the present disclosure, to distinguish two electrodes of a transistor except the gate electrode, one of the two electrodes is referred to as a first electrode and the other electrode is referred to as a second electrode. The first electrode may be a source electrode or a drain electrode, and the second electrode may be a drain electrode or a source electrode. In addition, the gate electrode of the transistor is referred to as a control electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the present disclosure.

In the present disclosure, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the present disclosure, "film" and "layer" are interchangeable. For example, a "conductive layer" may be replaced with a "conductive film" sometimes. Similarly, an "insulation film" may be replaced with an "insulation layer" sometimes.

In the present disclosure, "about" and "substantially" refer to that a boundary is not defined strictly and a case within a range of process and measurement errors is allowed. In the present disclosure, "substantially the same" refers to a case where values differ by less than 10%.

In the present disclosure, "width" means a length in a direction perpendicular an extension direction of a trace in a plane of extension of the trace.

In the present specification, "A extends along a B direction" means that A may include a main portion and a secondary portion connected to the main portion, the main portion is a line, a line segment, or a strip-shaped body, the main portion extends along the B direction, and a length of the main portion extending along the B direction is greater than a length of the secondary portion extending along another direction. "A extends in a B direction" in the present specification always means "a main portion of A extends in a B direction".

A display panel according to an embodiment of the present disclosure may be integrated with a touch structure. The display panel may include an organic light emitting diode (OLED) display substrate, or may be a Quantum Dot Light Emitting Diodes (QLED) display substrate, or may be a plasma display panel (PDP) display substrate, or may be an electrophoretic display (EPD) display substrate, or may be a liquid crystal display (LCD) substrate. In some examples, the display panel may include an OLED display substrate, and the OLED display substrate may include a base substrate, a drive circuit layer arranged on the base substrate, a light emitting element layer arranged on the drive circuit layer, and an encapsulation layer arranged on the light emitting element layer. The touch structure is arranged on the encapsulation layer of the display substrate to form a structure of Touch on Thin Film Encapsulation (Touch on TFE for short), and the touch structure is integrated with a display structure, which has advantages of lightness and thinness, and foldability, and may meet products requirements such as flexible folding and narrow bezels.

Structures of Touch on TFE mainly include a Flexible Multi-Layer On Cell (FMLOC for short) structure and a Flexible Single-Layer On Cell (FSLOC for short) structure. The FMLOC structure is based on a working principle of mutual capacitance detection, a drive (Tx) electrode and a sensing (Rx) electrode are generally formed by two layers of metal, and an Integrated Circuit (IC) achieves a touch action by detecting mutual capacitance between the drive electrode and the sensing electrode. The FSLOC structure is based on a working principle of self-capacitance (or voltage) detection, a touch electrode is generally formed by using a single layer of metal, and an integrated circuit achieves a touch action by detecting self-capacitance (or voltage) of the touch electrode.

Figure 1B:
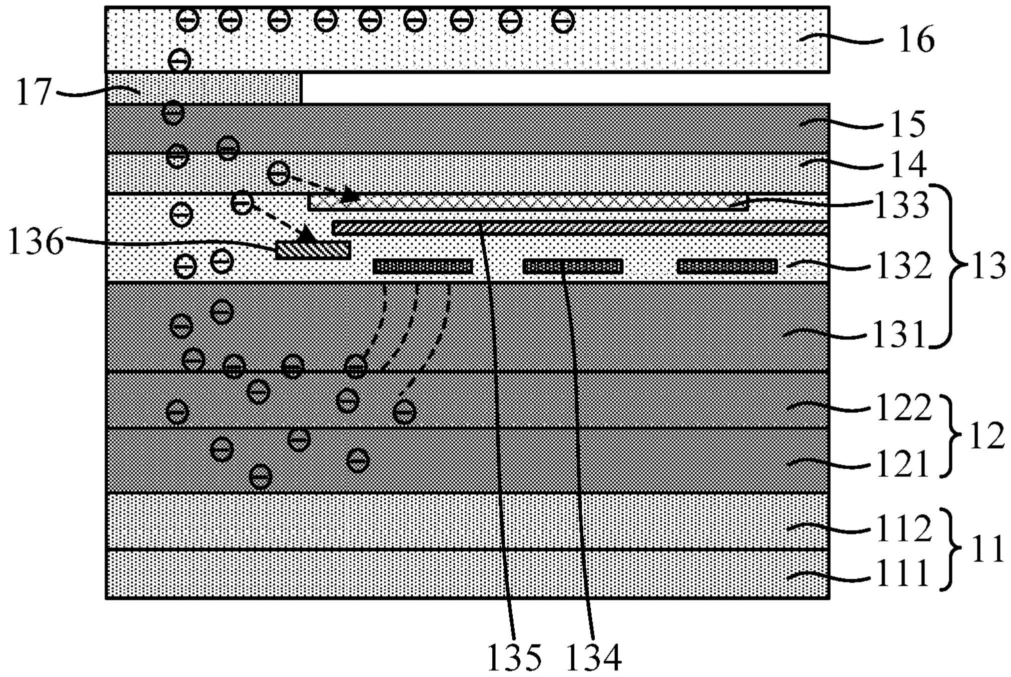
FIG. 1B is a schematic diagram of a negative electric field in a display panel formed by negative charges generated by friction on a surface of a cover plate.

FIG. 1A is a schematic diagram showing conduction of negative charges generated by friction on a surface of a cover plate of a display panel. FIG. 1B is a schematic diagram of a negative electric field in a display panel formed by negative charges generated by friction on a surface of a cover plate. Each of FIG. 1A and FIG. 1B show a cross-sectional structure of a display panel.

As shown in FIG. 1A and FIG. 1B, the display panel may include a heat dissipation film layer (SCF) 11, a carrier film layer (U-film) 12, a display touch substrate 13, a Polarizer (POL for short) 14, an Optically Clear Adhesive (OCA for short) layer 15, and a cover plate (CG) 16 which are arranged sequentially. The cover plate 16 may be a glass cover plate. The heat dissipation film layer 11 may include a conductive heat dissipation layer 111 and a non-conductive heat dissipation layer 112 which are stacked sequentially. The carrier film layer 12 may include a first carrier layer 121 and a second carrier layer 122 which are stacked sequentially. For example, a material of the first carrier layer 121 may be polyethylene terephthalate (PET), and a material of the second carrier layer 122 may be Pressure Sensitive Adhesive (PSA for short). The display touch substrate 13 may include a base substrate 131, a display structure layer 132 and a touch structure layer 133 which are arranged sequentially. The display structure layer 132 may include a drive circuit layer (e.g. including a plurality of pixel circuits) and a light emitting element layer (e.g. including a plurality of light emitting elements). Each pixel circuit is electrically connected to a light emitting element, and is configured to drive the light emitting element to emit light. The drive circuit layer may at least include a semiconductor layer 134 (e.g. an active layer including a transistor), a power supply trace 135 (e.g. a low-voltage line VSS), and a signal trace 136. Ink 17 is coated between the cover plate 16 and the optical adhesive layer 15 in a bezel region of the display panel.

As shown in FIG. 1A and FIG. 1B, a large number of negative charges are generated when a user's finger (corresponding to a metal rod) is rubbed against a surface of the cover plate 16. Since charges of a same polarity repel each other, negative charges will diffuse. Since most of the material of the film layer the display panel is a high-resistance material, static electricity is more easily conducted up and down (i.e. conducted along a vertical cross-sectional direction) than conducted transversely (i.e. conducted along a horizontal plane direction), and therefore static electricity accumulates on the surface of the cover plate 16 and then conducts to a lower layer. Since a metal film layer of the display structure layer 132 (for example, the power supply trace 135 and the signal trace 136) and a metal film layer of the touch structure layer 133 of the display touch substrate 13 may lead out static electricity, most of the static electricity is more likely to be transmitted sequentially to the lower layer from a position at an edge of the display panel where there is no metal layer. As shown in FIG. 1B, the cover plate 16, the optical adhesive layer 15, the polarizer 14, the display touch substrate 13, and the second carrier layer 122 of the carrier film layer 12 all have high conductivity against negative charges, the ink 17 and the non-conductive heat dissipation layer 112 of the heat dissipation film layer 11 have medium conductivity against negative charges, and the first carrier layer 121 of the carrier film layer 12 has low conductivity against negative charges. Therefore, the negative charges generated on the surface of the cover plate 16 is transferred from the edge of the display panel to the lower layer, passes through the optical adhesive layer 15, the polarizer 14, an insulation layer of the display touch substrate 13, and the base substrate 131 sequentially, and accumulates on a side of the base substrate 131 of the display touch substrate 13 away from the cover plate 16 (i.e., the back surface) to form a negative electric field. The negative electric field formed on the display touch substrate 13 causes a threshold voltage (Vth) of the transistor of the drive circuit layer to be biased forward, thereby making the display touch substrate 13 be illuminated. For example, since the green sub-pixel is sensitive to start, the display panel often shows poor display with greenish screen.

In some implementations, the display panel needs to be assembled with an antenna structure. After the display panel is assembled with the antenna structure, a metal film layer in the display panel which is overlapped with the antenna structure will affect the antenna structure, which will attenuate a Total Isotropic Sensitivity (TIS for short) and a signal reception and transmission of the antenna structure, and affect performance of the antenna structure.

In one aspect, an embodiment provides a display panel, including an active region and an edge region located on at least one side of the active region. The edge region includes an antenna projection region and a non-antenna projection region located on at least one side of the antenna projection region. The active region includes a base substrate, and a display structure layer and a touch structure layer arranged sequentially on the base substrate. The edge region includes an isolation dam and edge ground traces arranged on the base substrate. The edge ground traces are located on a side of the isolation dam away from the active region. An overlapping area between the edge ground traces and the antenna projection region is smaller than an overlapping area between the edge ground traces and the non-antenna projection region.

In some examples, the antenna projection region may be a projection region of the antenna structure on the display panel. The antenna projection region and the non-antenna projection region may both be located on a side of the isolation dam in the edge region away from the active region. The antenna projection region may not be overlapped with the non-antenna projection region. For example, the non-antenna projection region may surround a periphery of the antenna projection region, or the non-antenna projection region and the antenna projection region may be adjacent along one direction. This embodiment is not limited thereto.

In the display panel according to the embodiment, the negative charges generated on the surface of the cover plate of the display panel may be led out by arrangement of the edge ground traces in the edge region of the display panel, thereby blocking an electrostatic conduction path, reducing the negative electric field formed inside the display panel, and improving the illumination of the display structure layer caused by the negative electric field. Moreover, by reducing the overlapping area between the edge ground traces and the antenna projection region, influence of the edge ground traces on the Total Isotropic Sensitivity and the signal reception and transmission of the antenna structure may be reduced, and a shielding and interference of the edge ground traces on antenna signals may be reduced, thus ensuring the performance of the antenna structure.

In some exemplary implementations, the overlapping area between the edge ground traces and the antenna projection region may be less than or equal to 7% of the antenna projection region. Among them, a proportion of the overlapping area between the edge ground traces and the antenna projection region in the antenna projection region may be equal to a proportion of the overlapping area between the edge ground traces and the antenna projection region to a total area of the antenna projection region. In some examples, the edge ground traces may be not overlapped with the antenna projection region. In other words, the overlapping area between the edge ground traces and the antenna projection region may be 0. In this example, by providing the edge ground traces to completely avoid the antenna structure, the negative charges generated on the surface of the cover plate of the display panel may be led out and the shielding and interference to antenna signals may be avoided. In some examples, the proportion of the overlapping area between the edge ground traces and the antenna projection region in the antenna projection region may be about 7%. In this example, by providing the edge ground traces to completely avoid the antenna structure, not only an effect that the negative charges generated on the surface of the cover plate of the display panel are led out may be ensured, but also the shielding and interference to antenna signals may be reduced, so that the leading out of the electrostatic of the display panel and the performance of the antenna structure may achieve better effects.

In some exemplary implementations, the edge ground traces may include an outer ring trace, an inner ring trace, and a plurality of first connection traces. The plurality of first connection traces are connected to the inner ring trace and the outer ring trace. For example, the inner ring trace, the outer ring trace and the plurality of first connection traces may be of an integral structure. The outer ring trace may be located on a side of the inner ring trace away from the active region. The plurality of first connection traces may be located in the non-antenna projection region, and in other words, the plurality of first connection traces may not be overlapped with the antenna projection region. In this example, the inner ring trace, the first connection trace and the outer ring trace may be used to lead out the negative charges generated on the surface of the cover plate of the display panel, thereby blocking the electrostatic conduction path and improving a display effect of the display panel.

In some exemplary implementations, an orthographic projection of the first connection trace on the base substrate may be a zigzag trace. Among them, the zigzag trace is a bending curve. For example, after one end of the trace extends along one direction for a certain distance, it bends circuitously and extends along an opposite direction of this direction for a certain distance, bends circuitously again and extends along this direction, and in this way, repeatedly bends circuitously several times to form a zigzag trace. In this example, by providing the first connection trace as a zigzag trace, a resistance of the edge ground traces may be increased, thus preventing electrostatic breakdown and serving a protective function.

In some exemplary implementations, the inner ring trace may include at least two inner ring trace segments and an inner ring connection segment connected to adjacent inner ring trace segments. A distance between the inner ring connection segment and an edge of the base substrate may be greater than a distance between an inner ring trace segment and the edge of the base substrate. In some examples, the inner ring trace may not be overlapped with the antenna projection region, and the inner ring connection segment of the inner ring trace may be located on a side of the antenna projection region close to the active region. In this example, the overlapping area between the edge ground traces and the antenna projection region may be reduced by providing the inner ring connection segment to be retracted into the active region to bypass the antenna projection region, thus improving the shielding and interference of the edge ground traces to antenna signals. Moreover, keeping the inner ring trace continuous near the antenna projection region may ensure that the negative charges generated on the surface of the cover plate of the display panel are led out, thereby blocking the electrostatic conduction path and improving the display effect of the display panel.

In this example, the distance between a certain trace and an edge of the base substrate may be referred to a distance between the trace and a nearest edge of the base substrate. In the edge region, the edge of the base substrate may be flush with the edge of the edge ground traces.

In some exemplary implementations, the outer ring trace may be not overlapped with the antenna projection region. For example, the outer ring trace may include two outer ring trace segments located in the non-antenna projection region. The two outer ring trace segments are not overlapped with the antenna projection region. In other words, the antenna projection region may not be provided with the outer ring trace. In this example, by cutting off the outer ring trace in the antenna projection region to avoid the antenna projection region, the overlapping area between the edge ground traces and the antenna projection region may be reduced, thus improving the shielding and interference of the edge ground traces to antenna signals.

In some exemplary implementations, the outer ring trace may include at least two outer ring trace segments, and an outer ring connection segment connected to adjacent outer ring trace segments. The at least two outer ring trace segments are located in the non-antenna projection region. A distance between the outer ring connection segment and an edge of the base substrate may be greater than a distance between an outer ring trace segment and the edge of the base substrate. In some examples, the outer ring connection segment of the outer ring trace may be located on a side of the antenna projection region close to the inner ring trace. For example, the outer ring connection segment and the antenna projection region may not be overlapped with each other. In this example, the overlapping area between the edge ground traces and the antenna projection region is thus reduced by providing the outer ring connection segment to be retracted into the active region to bypass the antenna projection region, thus improving the shielding and interference of the edge ground traces to antenna signals. Moreover, keeping the outer ring trace continuous near the antenna projection region may ensure that the negative charges generated on the surface of the cover plate of the display panel are led out, thereby blocking the electrostatic conduction path and improving the display effect of the display panel. In some other examples, the outer ring connection segment of the outer ring trace may be overlapped with the antenna projection region. For example, a width of the outer ring connection segment may be smaller than a width of an outer ring trace segment. In this example, by reducing the overlapping area between the outer ring trace and the antenna projection region, the shielding and interference of the edge ground traces to antenna signals may be improved.

In some exemplary implementations, a portion of the edge ground traces located on a side of the antenna projection region close to the active region are first traces, and a portion of the edge ground traces located on a side of the non-antenna projection region close to the active region are second traces. A distance between an edge at a side of the first traces close to the active region and an edge of the base substrate may be greater than a distance between an edge at a side of the second traces close to the active region and the edge of the base substrate. In some examples, the first traces may only include inner ring trace, or may include an inner ring trace and an outer ring trace that are not connected to each other, or may include an inner ring trace and an outer ring trace that are connected to each other. The second traces may include an inner ring trace, an outer ring trace, and a first connection trace connected to the inner ring trace and the outer ring trace. This embodiment is not limited thereto. In this example, the edge ground traces are provided to be retracted towards one side of the active region to completely avoid or partially avoid the antenna projection region, which may ensure an effect of leading out the negative charges generated on the surface of the cover plate of the display panel and reduce the shielding and interference to antenna signals.

In some exemplary implementations, the touch structure layer may include at least one touch conductive layer, and the edge ground traces and the touch conductive layer may be disposed in a same layer. For example, the touch structure layer may include a plurality of touch conductive layers, and the edge ground traces may be in a same layer as a touch conductive layer closest to the cover plate, and the cover plate may be located on a side of the touch structure layer away from the base substrate. In this example, by providing the edge ground traces to be in the same layer as the touch conductive layer, most of the static electricity may be effectively led out, thus reducing the negative electric field formed inside the display panel, and improving the illumination problem caused by the negative electric field.

In some exemplary implementations, at least one touch conductive layer may include touch traces, and the edge ground traces may be located on a side of the touch traces away from the active region. For example, the touch traces may include a plurality of second panel crack detection lines. In the edge region, a plurality of touch leads, a guard line, a first ground line and a plurality of second panel crack detection lines may be arranged sequentially along a direction away from the active region.

The display panel according to this embodiment will be illustrated by some examples below.

Figure 2:
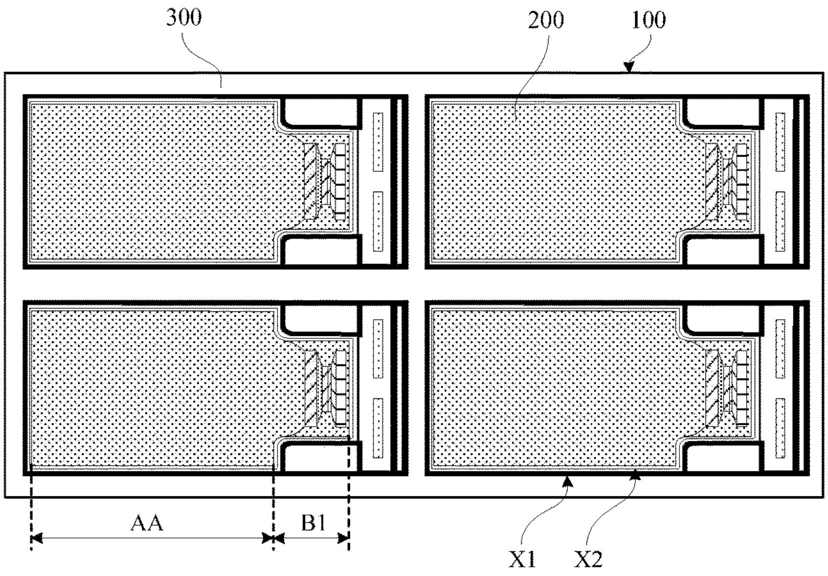
FIG. 2 is a schematic diagram of an arrangement of a plurality of display touch substrates included on a display motherboard.

In some examples, a flexible display panel is taken as an example. In a preparation process of the flexible display panel, a display motherboard is prepared firstly, and then the display motherboard is cut, so that the display motherboard is divided into a plurality of display touch substrates, and the separated display touch substrates may be used to form a single display panel. FIG. 2 is a schematic diagram of an arrangement of a plurality of display touch substrates included on a display motherboard. As shown in FIG. 2, a plurality of substrate regions 200 on the display mother plate 100 are periodically and regularly arranged, and a cutting region 300 is located outside the substrate regions 200. Each substrate region 200 at least includes an active region AA and a bonding region B1 located on at least one side of the active region AA. For example, the active region AA may include a plurality of sub-pixels arranged regularly and the bonding region B1 may include a fan-out region and bonding pins. A first cutting path X1 and a second cutting path X2 are provided in the cutting region 300. After all the film layers of the display motherboard are prepared, a cutting equipment performs rough cutting and fine cutting along the first cutting path X1 and the second cutting path X2 to form a display touch substrate.

Figure 3:
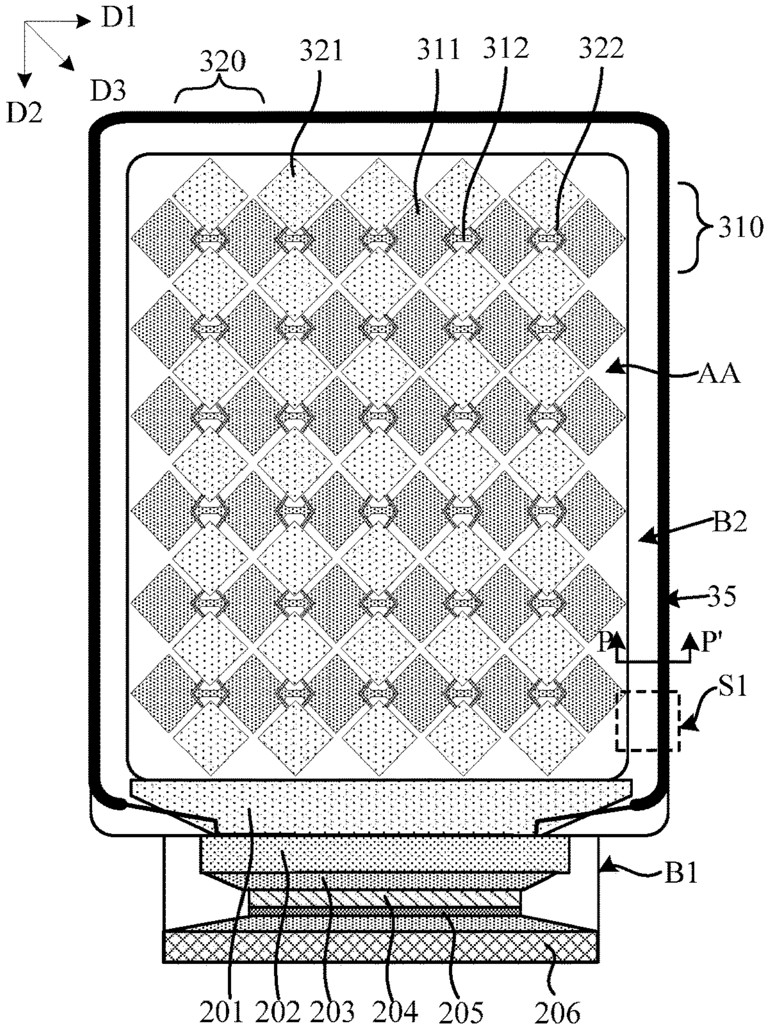
FIG. 3 is a schematic diagram of a display panel according to at least one embodiment of the present disclosure.

FIG. 3 is a schematic diagram of a display panel according to at least one embodiment of the present disclosure. The display panel of this example is illustrated by taking an FMLOC structure as an example. However, this embodiment is not limited thereto. In some other examples, the display panel may be in an FSLOC structure with a single touch conductive layer.

In some examples, as shown in FIG. 3, in a plane parallel to the display panel, the display panel may include an active region AA, and a peripheral region located at a periphery of the active region AA. The peripheral region may include a bonding region B1 located on one side of the active region AA and an edge region B2 located on another side of the active region AA. For the stacked display substrate and touch structure, the active region AA may be either a touch region or a display region, and both the touch region and the display region in the following description refer to active regions AA.

In some examples, as shown in FIG. 3, the touch region may at least include a plurality of touch electrodes arranged regularly, the edge region B2 at least includes a plurality of touch leads, and the edge ground traces 35, and the bonding region B1 at least includes pins connecting the plurality of touch leads and the edge ground traces 35 to an external control device. The negative charges generated on the surface of the cover plate may be led out by arranging the edge ground traces 35 in the peripheral region of the display panel, thereby blocking the electrostatic conduction path, reducing the negative electric field formed inside the display panel, and improving the illumination of the display structure layer caused by the negative electric field.

In some examples, the touch structure may be in a mutual capacitance structure. As shown in FIG. 3, the touch region may include a plurality of first touch units 310 and a plurality of second touch units 320. The first touch units 310 may have a linear shape extending along a first direction D1 and the plurality of first touch units 310 may be arranged sequentially along a second direction D2. The second touch units 320 may have a linear shape extending along the second direction D2 and the plurality of second touch units 320 may be arranged sequentially along the first direction D1. Among them, the first direction D1 intersects with the second direction D2, for example, the first direction D1 may be perpendicular to the second direction D2. Each first touch unit 310 may include a plurality of first touch electrodes 311 and first connection portions 312 which are arranged sequentially along the first direction D1, and the first touch electrodes 311 and the first connection portion 312 are alternately arranged and electrically connected sequentially. Each second touch unit 320 may include a plurality of second touch electrodes 321 arranged sequentially along the second direction D2, and the plurality of second touch electrodes 321 are arranged at intervals. Adjacent second touch electrodes 321 are electrically connected to each other by a second connection portion 322. In some examples, a film layer where the second connection portions 322 are located may be different from film layers where the first touch electrodes 311 and the second touch electrodes 321 are located. The first touch control electrodes 311 and the second touch control electrodes 321 may be alternately arranged in a third direction D3, and the third direction D3 may intersect with both the first direction D1 and the second direction D2.

In some examples, the plurality of first touch electrodes 311, the plurality of second touch electrodes 321, and the plurality of first connection portions 312 may be arranged on a same layer, i.e., a touch layer, and may be formed through a same patterning process, and the first touch electrodes 311 and the first connection portions 312 may be connected to each other in an integrated structure. The second connection portions 322 may be arranged on a bridging layer, and adjacent second touch electrodes 321 are electrically connected to each other through a via. A touch insulation layer is arranged between the touch layer and the bridging layer. In some possible implementations, the plurality of first touch electrodes 311, the plurality of second touch electrodes 321 and the plurality of second connection portions 322 may be arranged on a same layer, i.e., the touch layer, and the second touch electrodes 321 and the second connection portions 322 may be connected to each other in an integrated structure. The first connection portions 312 may be arranged on the bridging layer and adjacent first touch electrodes 311 are electrically connected to each other through vias. In some examples, the first touch control electrodes may be drive (Tx) electrodes and the second touch control electrodes may be sensing (Rx) electrodes. Or, the first touch control electrodes may be sensing (Rx) electrodes and the second touch control electrodes may be drive (Tx) electrodes. However, this embodiment is not limited thereto.

In some examples, the first touch control electrodes 311 and the second touch control electrodes 321 may each have a rhombus shape, such as a regular rhombus, a horizontally longer rhombus, or a vertically longer rhombus. In some possible implementations, the first touch electrodes 311 and the second touch electrodes 321 may have any one or more of shapes of triangles, squares, trapezoids, parallelograms, pentagons, hexagons, and other polygons, which are not limited in the present disclosure.

In some examples, the first touch electrodes 311 and the second touch electrodes 321 may be in a form of transparent conductive electrodes. In some examples, the first touch electrodes 311 and the second touch electrodes 321 may be in a form of metal meshes. The metal mesh is formed by a plurality of interweaving metal wires and includes a plurality of mesh patterns. The mesh patterns are polygons formed by a plurality of metal wires. The first touch electrodes 311 and the second touch electrodes 321 in the form of the metal mesh have advantages of small resistance, small thickness, fast response speed, and the like.

In some examples, as shown in FIG. 3, the bonding region B1 is located on a side of the active region AA, and in a direction away from the active region AA (e.g., the second direction D2), the bonding region B1 may include a first fan-out region 201, a bending region 202, a second fan-out region 203, an anti-static region 204, a drive chip region 205, and a bonding pin region 206 arranged sequentially. The first fan-out region 201 may be provided with signal transmission lines and touch leads of the display substrate. The signal transmission lines of the display substrate may at least include a high-voltage line VDD, a low-voltage line VSS and a plurality of data transmission lines. The plurality of data transmission lines are configured to be connected to data lines of the display region in a fan-out tracing manner, and the high-voltage line VDD and the low-voltage line VSS are configured to be connected to a high-level power line and a low-level power line of the display substrate respectively. The plurality of touch leads are configured to be correspondingly connected to a plurality of pins of the bonding pin region 206. A groove may be formed in the bending region 202. The groove is configured to bend the second fan-out region 203, the anti-static region 204, the drive chip region 205, and the bonding pin region 206 to a back surface of the active region AA. The second fan-out region 203 may be provided with a plurality of touch leads and a plurality of data transmission lines which are led out in a fan-out manner. An anti-static circuit may be provided in the anti-static region 204. The anti-static circuit is configured to eliminate static electricity. A source drive circuit (Driver IC) may be provided in the drive chip region 205. The source drive circuit is configured to be electrically connected to the plurality of data transmission lines in the second fan-out region 203. In some possible implementations, the driver chip region 205 may be provided with a Touch and Display Driver Integration (TDDI for short) circuit. The bonding pin region 206 may be provided with a plurality of pins, which are correspondingly connected to the plurality of touch leads and a plurality of signal transmission lines of the source drive circuit, and are connected to an external control device through a flexible printed circuit board (FPC) bound thereto.

In some examples, as shown in FIG. 3, the edge region B2 is located on several sides of the active region AA away from the bonding region B1. For example, the bonding region B1 may be located on a lower side of the active region AA, and the edge region B2 may be located on an upper side, a left side and a right side of the active region AA. The edge region B2 is at least provided with edge ground traces 35 and a plurality of touch leads. The edge ground traces 35 may extend from the edge region B2 to the bonding region B1, and are electrically connected to ground pins in the bonding pin region 206 of the bonding region B1.

In some examples, the plurality of touch leads may include a plurality of drive leads and a plurality of sensing leads. Taking the first touch electrodes being drive electrodes and the second touch electrodes being sensing electrodes as an example, first ends of the drive leads are electrically connected to the first touch electrodes respectively, and second ends of the drive leads extends to the bonding region B1 along the edge region B2. First ends of the sensing leads are electrically connected to second touch control electrodes, and second ends of the sensing leads extend along the edge region B2 to the bonding region B1. However, this embodiment is not limited thereto.

In some examples, the outer sides of the bonding region B1 and the edge region B2 are provided with a first cutting line and a second cutting line. The second cutting line is a fine cutting line located at a periphery of the bonding region B1 and the edge region B2, and a shape of the second cutting line is the same as outer contours of the bonding region B1 and the edge region B2. The first cutting line is a rough cutting line and is located at a periphery of the second cutting line, and a shape of the first cutting line may be approximately the same as a contour of the second cutting line. In this example, the edge of the edge ground traces 35 away from the active region AA may be obtained by the second cut line. However, this embodiment is not limited thereto.

Figure 4:
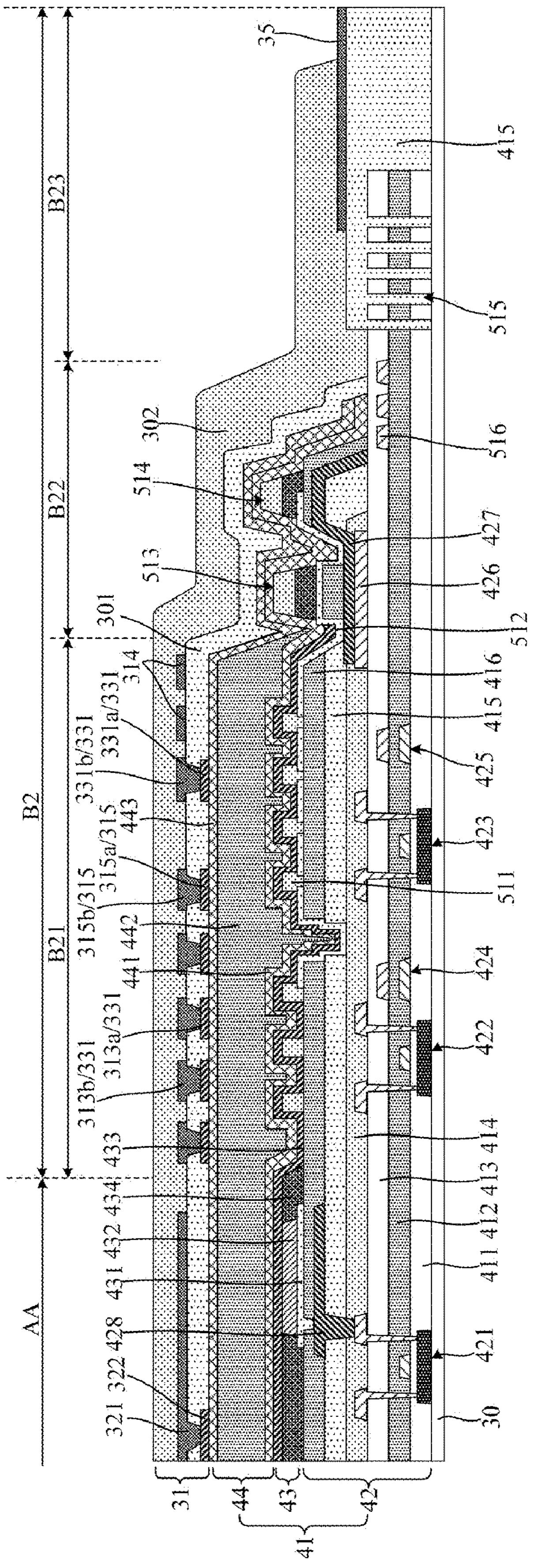
FIG. 4 is a partial cross-sectional view along direction P-P' in FIG. 3.

FIG. 4 is a partial cross-sectional view along direction P-P' in FIG. 3. In some examples, as shown in FIG. 3 and FIG. 4, in a direction perpendicular to the display panel, the display panel of the active region AA may include a base substrate 30, a display structure layer 41 and a touch structure layer 31 that are arranged sequentially on the base substrate 30. The display structure layer 41 may include a drive circuit layer 42, a light emitting structure layer 43 and an encapsulation layer 44 that are arranged sequentially on the base substrate 30. The touch structure layer 31 takes the encapsulation layer 44 as a base substrate. In some possible implementations, the display structure layer may include other film layers and other film layers may also be arranged between the touch control structure layer and the encapsulation layer, which is not limited here in the present disclosure.

In some examples, the base substrate 30 may include a first flexible material layer, a first inorganic material layer, a semiconductor layer, a second flexible material layer, and a second inorganic material layer which are stacked, materials of the first flexible material layer and the second flexible material layer may be Polyimide (PI), Polyethylene Terephthalate (PET), or a polymer soft film after a surface treatment, etc. Materials of the first inorganic material layer and the second inorganic material layer may be Silicon Nitride (SiNx) or Silicon Oxide (SiOx), etc., for improving capabilities of water-resistance and oxygen-resistance of the base substrate, and a material of the semiconductor layer may be amorphous silicon (a-si). However, this embodiment is not limited thereto.

In some examples, the drive circuit layer 42 of the active region AA may include transistors and storage capacitors constituting a pixel circuit. FIG. 4 illustrates one transistor (e.g. a first transistor 421) of a pixel circuit of one sub-pixel of the active region AA as an example. In some examples, as shown in FIG. 4, the drive circuit layer 42 of the active region AA may include a semiconductor layer, a first insulation layer 411, a first gate metal layer, a second insulation layer 412, a second gate metal layer, a third insulation layer 413, a first source-drain metal layer, a fourth insulation layer 414, a first planarization layer 415, a second source-drain metal layer, and a second planarization layer 416 which are arranged sequentially on the base substrate 30. In some examples, the semiconductor layer at least includes an active layer of the first transistor 421. The first gate metal layer at least includes a gate electrode of the first transistor 421, and a first capacitor plate of a capacitor of the pixel circuit. The second gate metal layer at least includes a second capacitor plate of a capacitor of the pixel circuit. The first source-drain metal layer at least includes a first electrode and a second electrode of the first transistor 421. The second source-drain metal layer at least includes an anode connection electrode 428, and the anode connection electrode 428 is configured to be connected to an anode of the light emitting element and the pixel circuit.

In some examples, the first insulation layer 411, the second insulation layer 412, the third insulation layer 413, and the fourth insulation layer 414 may be inorganic insulation layers, and first planarization layer 415 and the second planarization layer 416 may be organic insulation layers. For examples, the first insulation layer 411, the second insulation layer 412, the third insulation layer 413, and the fourth insulation layer 414 may be made of any one or more of Silicon Oxide (SiOx), Silicon Nitride (SiNx), and Silicon Oxynitride (SiON), and may be a single layer, a multi-layer, or a composite layer. Among them, the first insulation layer 411 and the second insulation layer 412 may be referred to as Gate Insulation (GI) layers, the third insulation layer 413 may be referred to as an Interlayer Dielectric (ILD) layer, and the fourth insulation layer 414 may be referred to as a passivation (PVX) layer. The first gate metal layer, the second gate metal layer, the first source-drain metal layer, and the second source-drain metal layer may be made of a metal material, such as any one or more of silver (Ag), copper (Cu), aluminum (Al), titanium (Ti), and molybdenum (Mo), or an alloy material of the above metals, such as an Aluminum Neodymium (AlNd) alloy or a Molybdenum Niobium (MoNb) alloy, and may be in a single-layer structure or a multi-layer composite structure, such as Ti/Al/Ti. The semiconductor layer may be made of a material, such as an amorphous indium gallium zinc oxide material (a-IGZO), zinc oxynitride (ZnON), indium zinc tin oxide (IZTO), amorphous silicon (a-Si), polycrystalline silicon (p-Si), sexithiophene or polythiophene, that is, the present disclosure is applicable to transistors manufactured based on oxide technology, silicon technology or organic technology.

In some examples, as shown in FIG. 4, the light emitting structure layer 43 of the active region AA may include an anode 431, a pixel definition layer 434, an organic light emitting layer 432, and a cathode 433. The anode 431 is arranged on the second planarization layer 416, and is electrically connected to an anode connection electrode 428 through a via formed in the second planarization layer 416. The pixel definition layer 434 is arranged on the anode 431 and the second planarization layer 416, on which a pixel opening is formed, and the pixel opening exposes at least a portion of a surface of the anode 431. The organic light emitting layer 432 is arranged within the pixel opening, and the cathode 433 is arranged on the organic light emitting layer 432, wherein the organic light emitting layer 432 emits light with corresponding colors under the action of voltages applied by the anode 431 and the cathode 433. In some examples, the pixel definition layer 434 may be made of a material such as polyimide, acrylic, or polyethylene terephthalate.

In some exemplary implementations, as shown in FIG. 4, the encapsulation layer 44 of the active region AA may include a first encapsulation layer 441, a second encapsulation layer 442 and a third encapsulation layer 443 that are stacked. The first encapsulation layer 441 and the third encapsulation layer 443 may be made of an inorganic material, the second encapsulation layer 442 may be made of an organic material, and the second encapsulation layer 82 is arranged between the first encapsulation layer 441 and the third encapsulation layer 443, which may ensure that external vapor can not enter into the light emitting structure layer 43.

In some examples, as shown in FIG. 4, the touch structure layer 31 of the active region AA may include a buffer layer (omitted in FIG. 4), a first touch conductive layer (TMA), a first touch insulation layer (TLD) 301, a second touch conductive layer (TMB), and a second touch insulation layer (TOC) 302 that are stacked sequentially. For example, the first touch conductive layer may be the bridging layer above described, and the second touch conductive layer may be the touch layer above described. The first touch conductive layer may include the second connection portions 322, and the second touch conductive layer may include the first touch electrodes 311, the second touch electrodes 321, and the first connection portions 312. In some examples, the buffer layer and the first touch insulation layer 301 may be made of an inorganic material, and the second touch insulation layer 302 may be made of an organic material. For example, the buffer layer and the first touch insulation layer 301 may be made of any one or more of silicon oxide (SiOx), silicon nitride (SiNx), and silicon oxynitride (SiON), and may be in a single layer, a plurality of layers, or a composite layer. The second touch insulation layer 302 may be made of polyimide (PI) or the like. However, this embodiment is not limited thereto.

In some examples, as shown in FIG. 4, the edge region B2 may include a first sub-edge region B21, a second sub-edge region B22, and a third sub-edge region B23 along a direction away from the active region AA. The first sub-edge region B21 at least includes a gate drive circuit, a plurality of touch leads 313, and a first ground trace 331. In some examples, the touch leads 313 and the first ground trace 331 may be of a double-layer trace structure. For example, one touch lead 313 may include a first sub-lead 313*a* and a second sub-lead 313*b* electrically connected to each other. The first ground trace 331 may include a first sub-ground trace 331*a* and a second sub-ground trace 331*b* electrically connected to each other. The second sub-edge region B22 is located on a side of the first sub-edge region B21 away from the active region AA, and the second sub-edge region B22 at least includes a first isolation dam 513, a second isolation dam 514, and at least one (e.g. three) first Panel Crack Detection (PCD for short) line 516. The at least one first panel crack detection line 516 may be configured to detect the display structure layer 41. The third sub-edge region B23 is located on a side of the second sub-edge region B22 away from the active region AA, and the third sub-edge region B23 may at least include a crack dam 515 and edge ground traces 35.

In some examples, as shown in FIG. 4, the display panel of the first sub-edge region B21 may include a base substrate 30, and a drive circuit layer 42, a first planarization layer 415, a second planarization layer 416, a first connection electrode 512, an isolation post 511, a cathode 433, an encapsulation layer 44, a plurality of first sub-leads 313*a* and a first sub-ground trace 331 arranged on the encapsulation layer 44, a first touch insulation layer 301, a plurality of second sub-leads 313*b* and a second sub-ground trace 331*b* arranged on the first touch insulation layer 301, and a second touch insulation layer 302 which are arranged sequentially on the base substrate 30. The drive circuit layer 42 of the first sub-edge region B21 may include a transistor and a storage capacitor constituting a gate drive circuit. In some examples, the gate drive circuit of the first sub-edge region B21 may include a scan drive circuit and a light emitting control drive circuit. The edge region B2 is illustrated in FIG. 4 by taking one transistor (e.g. a second transistor 422) and one capacitor (e.g. a first capacitor 424) of the scan drive circuit, and one transistor (e.g. a third transistor 423) and one capacitor (e.g. a second capacitor 425) of the light emission control drive circuit as an example. A film layer structure of the drive circuit layer of the first sub-edge region B21 may be similar to a film layer structure of the drive circuit layer of the active region AA, and therefore will not be described here.

In some examples, as shown in FIG. 4, the first sub-ground trace 331*a* and the plurality of first sub-leads 313*a* may be disposed in a same layer as the first touch conductive layer, the second sub-ground trace 331*b* and the plurality of second sub-leads 313*b* may be disposed in a same layer as the second touch conductive layer, and the plurality of first sub-leads 313*a* and the plurality of second sub-leads 313*b* may be electrically connected in a one to one correspondence, thereby achieving the touch leads 313 of the double-layer trace structure. The first sub-ground trace 331*a* and the second sub-ground trace 331*b* are electrically connected to each other to achieve the first ground trace 331 of the double-layer trace structure. A guard line may be provided between the touch leads 313 and the first ground trace 331, and the guard line 315 may include a first guard sub-line 315*a* and a second guard sub-line 315*b* electrically connected, wherein the first guard sub-line 315*a* and the first touch conductive layer may be disposed in a same layer, and the second guard sub-line 315*b* and the second touch conductive layer may be disposed in a same layer. In other words, in this example, the guard line 315 may be in a double-layer trace structure. At least one (e.g. two) second panel crack detection lines 314 may also be arranged on a side of the first ground line 331 away from the touch leads 313 and the guard line 315. The at least one second panel crack detection line 314 may be configured to detect the touch structure layer 31. The At least one second panel crack detection line 314 may be disposed in a same layer as the second touch conductive layer. However, this embodiment is not limited thereto. In some other examples, the first ground trace 331, the touch leads 313, and the guard line 315 may be in a single-layer trace structure, which may be, for example, in a same layer structure as the first touch conductive layer or may be disposed in a same layer as the second touch conductive layer.

In some examples, as shown in FIG. 4, the display panel of the second sub-edge region B22 may include a base substrate 30, and a composite insulation layer, a first panel crack detection line 516, a low-voltage line 426, a second connection electrode 427, isolation dams (e.g., a first isolation dam 513 and a second isolation dam 514), a first encapsulation layer 441, a third encapsulation layer 443, a first touch insulation layer 301 and a second touch insulation layer 302 which arranged on the base substrate 30. The composite insulation layer may include a first insulation layer 411 to a third insulation layer 413 that are stacked on the base substrate 30. The first panel crack detection line 516 may be arranged on the second insulation layer 412, and may be disposed in a same layer as the second gate metal layer. The low-voltage line 426 may be disposed in a same layer as the first source-drain metal layer of the drive circuit layer 42, and the second connection electrode 427 may be disposed in a same layer as the second source-drain metal layer of the drive circuit layer 42. The cathode 433 may be electrically connected to the second connection electrode 427 through the first connection electrode 512 which may be electrically connected to the low-voltage line 426 through the second connection electrode 427. The first isolation dam 513 is located on a side of the second isolation dam 514 close to the active region AA. The second isolation dam 514 may be formed by stacking a first dam foundation, a second dam foundation, a third dam foundation, and a fourth dam foundation. The first isolation dam 513 may be formed by stacking a second dam foundation, a third dam foundation, and a fourth dam foundation. The first dam foundation may be disposed in a same layer as the first planarization layer 415, the second dam foundation may be disposed in a same layer as the second planarization layer 416, the third dam foundation may be disposed in a same layer as the pixel definition layer 434, and the fourth dam foundation may be disposed in a same layer as the isolation post 511. However, this embodiment is not limited thereto.

In some examples, as shown in FIG. 4, the display panel of the third sub-edge region B23 may include a crack dam 515 arranged on the base substrate 30, and edge ground traces 35. The crack dam 515 is formed on the composite insulation layer, and may include a plurality of cracks which are arranged at intervals, and the cracks may expose the base substrate 30. The first planarization layer 415 may cover the crack dam 515. The edge ground traces 35 may be arranged on the first planarization layer 415 covering the crack dam 515. The second touch insulation layer 302 may expose a portion of surfaces of the edge ground traces 35. In some examples, an orthographic projection of the first touch insulation layer 301 on the base substrate 30 may not be overlapped with an orthographic projection of the edge ground traces 35 on the base substrate 30. A boundary of the first touch insulation layer 301 may be located on a side of the edge ground traces 35 close the active region AA. The orthographic projection of the edge ground traces 35 on the base substrate 30 may be partially overlapped with an orthographic projection of the crack dam 515 on the base substrate 30. However, this embodiment is not limited thereto. For example, the orthographic projection of the first touch insulation layer 301 on the base substrate 30 may be partially overlapped with an orthographic projection of the edge ground traces 35 on the base substrate 30. In this example, the crack dam 515 in a concave-convex shape formed in the edge region B2 is a film layer structure for avoiding an influence on the active region AA and the first sub-edge region B21 during cutting of the display motherboard. The plurality of cracks arranged at intervals can not only reduce stresses on the active region AA and the first sub-edge region B21, but also cut off propagation of cracks towards a direction of the active region AA and the first sub-edge region B21.

In some examples, as shown in FIG. 4, the edge ground traces 35 and the second touch conductive layer may be disposed in a same layer. However, this embodiment is not limited thereto. In some other examples, the edge ground traces may be disposed in a same layer as any conductive layer of the touch structure layer close to the base substrate.

In this exemplary embodiment, by arranging the edge ground traces 35 in the third sub-edge region B23 of the peripheral region, the negative charges generated by the friction on the surface of the cover plate may be led out by using the edge ground traces 35. Moreover, since the second touch conductive layer has a larger thickness and a smaller resistance than the first touch conductive layer, and the second touch conductive layer is closer to the cover plate than other conductive layers, most static electricity may be effectively led out by arranging the edge ground traces 35 to be in the same layer as the second touch conductive layer, thereby reducing a negative electric field formed inside the display panel and improving the illumination problem caused by the negative electric field.

In some examples, the orthographic projection of the edge ground traces 35 on the base substrate 30 may not be overlapped with an orthographic projection of other conductive layers on the base substrate 30. By providing the edge ground traces 35 to avoid all the metal film layer layers below, electrostatic damage to metal film layers below the edge ground traces 35 can be prevented.

Figure 5:
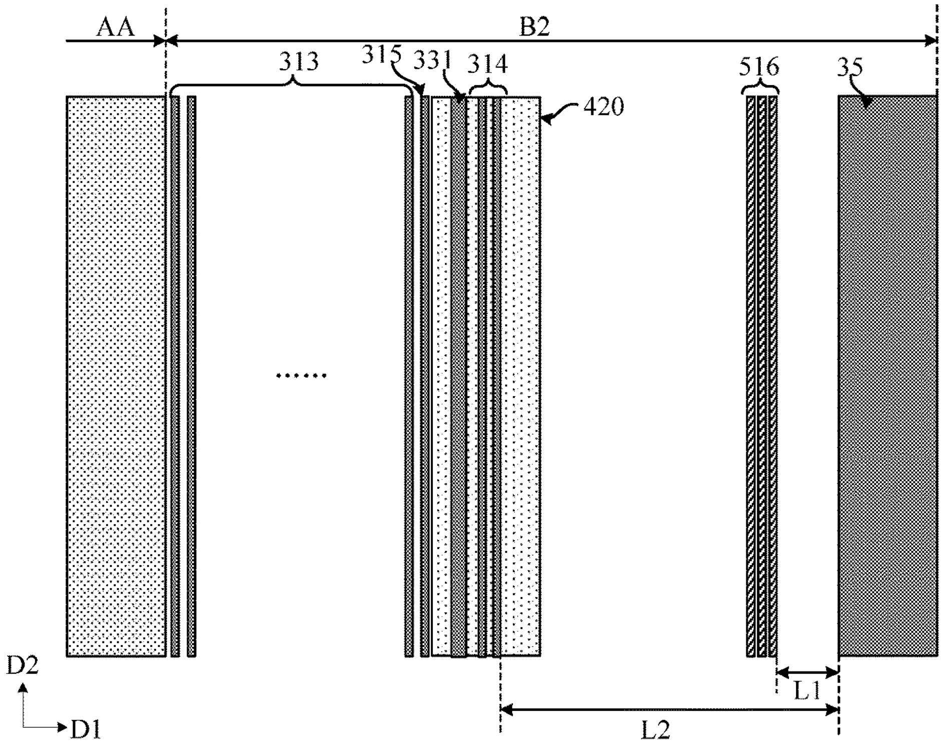
FIG. 5 is a partial enlarged view of a region S1 in FIG. 3.

FIG. 5 is a partial enlarged view of a region S1 in FIG. 3. In FIG. 5, positions of a gate drive electrode 420 and a plurality of traces (including, for example, a first ground trace 331, a plurality of touch leads 313, a guard line 315, a plurality of first panel crack detection lines 516, a plurality of second panel crack detection lines 314, and edge ground traces 35) in the edge region B2 are briefly illustrated, and the rest of the structures are omitted.

In some examples, as shown in FIG. 5, the first ground trace 331 may be located on a side of the plurality of touch leads 313 away from the active region AA, the guard line 315 may be located between the first ground trace 331 and the plurality of touch leads 313, and the second panel crack detection lines 314 may be located on a side of the first ground trace 331 away from the guard line 315 and the plurality of touch leads 313. An orthographic projection of the first ground trace 331 and the second panel crack detection lines 314 on the base substrate may be overlapped with an orthographic projection of the gate drive circuit 420 on the base substrate. An orthographic projection of the first panel crack detection lines 516 on the base substrate may be located between an orthographic projection of the edge ground traces 35 on the base substrate and the orthographic projection of the second panel crack detection lines 314 on the base substrate. A closest metal trace on a side of the orthographic projection of the edge ground traces 35 close to the active region AA may be a first panel crack detection line 516. In some examples, the edge ground traces 35 and the first ground trace 331 may be electrically connected to a same ground pin in the bonding region or may be electrically connected to different ground pins. This embodiment is not limited thereto.

In some examples, as shown in FIG. 5, a width of an edge ground trace 35 may be greater than a width of the first ground trace 331. In this example, a width of a trace refers to a width of the trace on the display touch substrate formed after being cut by a cutting equipment. In some examples, a pitch L1 between the edge ground traces 35 and the closest first panel crack detection line 516 may be about 65 microns to 150 microns, which may be, for example, about 120 microns. A pitch L2 between the edge ground traces 35 and a closest second panel crack detection line 314 may be about 220 microns to 280 microns, which may be, for example, about 256 microns. However, this embodiment is not limited thereto.

Figure 6:
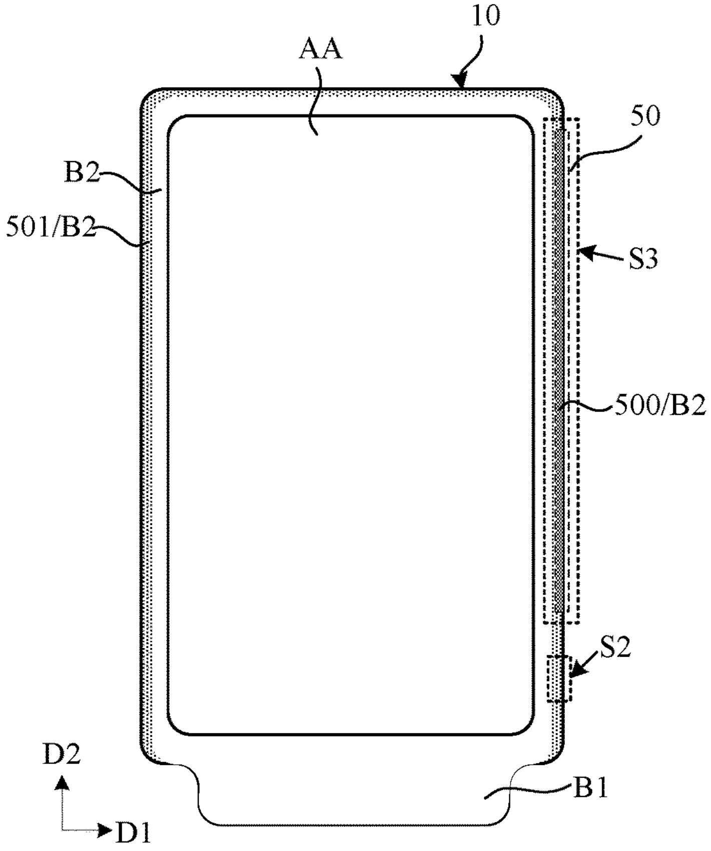
FIG. 6 is a schematic diagram of planar positions of a display panel and an antenna structure according to at least one embodiment of the present disclosure.
Figure 7:
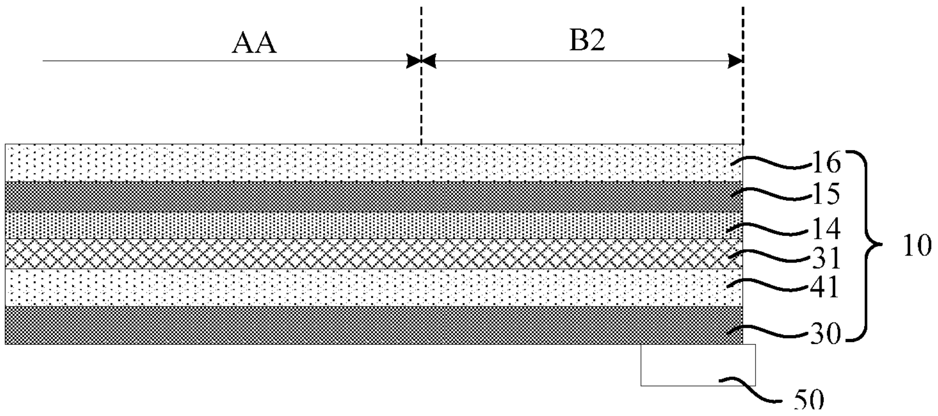
FIG. 7 is a schematic diagram of cross-sectional positions of a display panel and an antenna structure according to at least one embodiment of the present disclosure.

FIG. 6 is a schematic diagram of planar positions of a display panel and an antenna structure according to at least one embodiment of the present disclosure. FIG. 7 is a schematic diagram of cross-sectional positions of a display panel and an antenna structure according to at least one embodiment of the present disclosure. In FIG. 7, only a base substrate 30, a display structure layer 41, a touch structure layer 31, a polarizer 14, an optical adhesive layer 15, and a cover plate 16 of a display panel 10 are illustrated, and other structures are omitted.

In some examples, as shown in FIG. 6 and FIG. 7, the antenna structure 50 may be located on a side of the base substrate 30 of the display panel 10 away from the touch structure layer 31. For example, the antenna structure 50 may be partially overlapped with the display panel 10. An orthographic projection of the antenna structure 50 on the display panel 10 may be located in the edge region B2 of the peripheral region. An overlapping region between the antenna structure 50 and the display panel 10 may be an antenna projection region 500 of the display panel 10. For example, the antenna projection region 500 may be located in the edge region B2 on the right side of the display panel 10. In some examples, the antenna projection region 500 may be rectangular. For example, a length of the antenna projection region 500 may be about 100 mm (mm) to 140 mm, which may be, for example, about 122 mm, and a width of the antenna projection region 500 may be about 0.10 mm to 0.17 mm, which may be, for example, about 0.15 mm. The antenna projection region 500 may include an upper edge, a lower edge, a left edge, and a right edge, wherein the right edge of the antenna projection region 500 may be flush with aright edge of the display panel 10. For example, the left edge of the antenna projection region 500 may be parallel to the right edge, and the upper edge may be parallel to the lower edge. An orthographic projection of an upper edge of the antenna structure 50 on the display panel 10 may coincide with the upper edge of the antenna projection region 500, an orthographic projection of a lower edge of the antenna structure 50 on the display panel 10 may coincide with the lower edge of the antenna projection region 500, an orthographic projection of a left edge of the antenna structure 50 on the display panel 10 may coincide with the left edge of the antenna projection region 500, a right edge of the antenna structure 50 may not be overlapped with the display panel 10, and in other words, a right portion of the antenna structure 50 may protrude from the right edge of the display panel 10. However, this embodiment is not limited thereto. In some other examples, the orthographic projection of the right edge of the antenna structure 50 on the display panel 10 may coincide with the right edge of the antenna projection region 500. In some other examples, the orthographic projection of the antenna structure 50 on the display panel 10 may be located in the edge region B2 on the left side of the display panel 10. In some examples, as shown in FIG. 6, the non-antenna projection region 501 may surround the antenna projection region 500 on two sides of the second direction D2 and on one side of the first direction D1. For example, a region within the third sub-edge region of the edge region B2 other than the antenna projection region 500 may be the non-antenna projection region 501.

In some examples, as shown in FIG. 4 and FIG. 7, the display structure layer 41 has no metal film layer in the antenna projection region 500, and the metal film layer in the antenna projection region 500 includes only the edge ground traces 35. By arranging the edge ground traces 35 to bypass the antenna projection region 500, or by reducing an overlapping area between the edge ground traces 35 and the antenna projection region 500, metal film layers above the antenna structure 50 may be reduced, thereby improving the shielding and interference of the display panel 10 to antenna signals.

The structure of the edge ground traces is illustrated by several examples below. In the following example, an example that the edge ground traces and the second touch conductive layer being disposed in a same layer structure is taken. In this example, a direction along the active region AA toward the edge region B2 may be a fourth direction D4, and a direction which is in a same plane as the fourth direction D4 and intersects with the fourth direction D4 is a fifth direction D5. For example, the fifth direction D5 is in the same plane as the fourth direction D4, and the fifth direction D5 may be perpendicular to the fourth direction D4. In the region S2 and the region S3, the first direction D1 may be parallel to the fourth direction D4, and the second direction D2 may be parallel to the fifth direction D5.

Figure 8A:
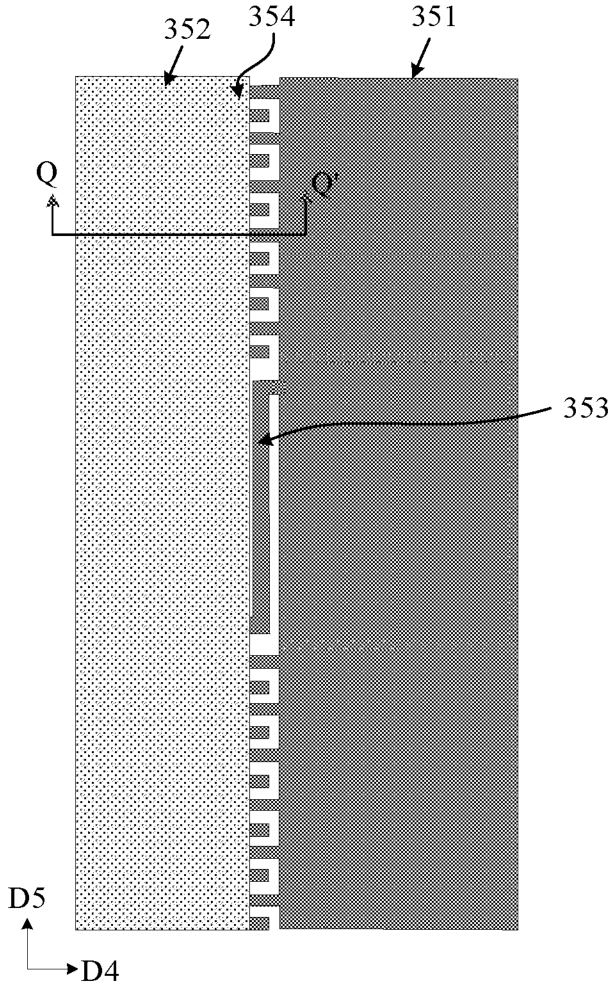
FIG. 8A is a partial plan view of a region S2 in FIG. 6.
Figure 8B:
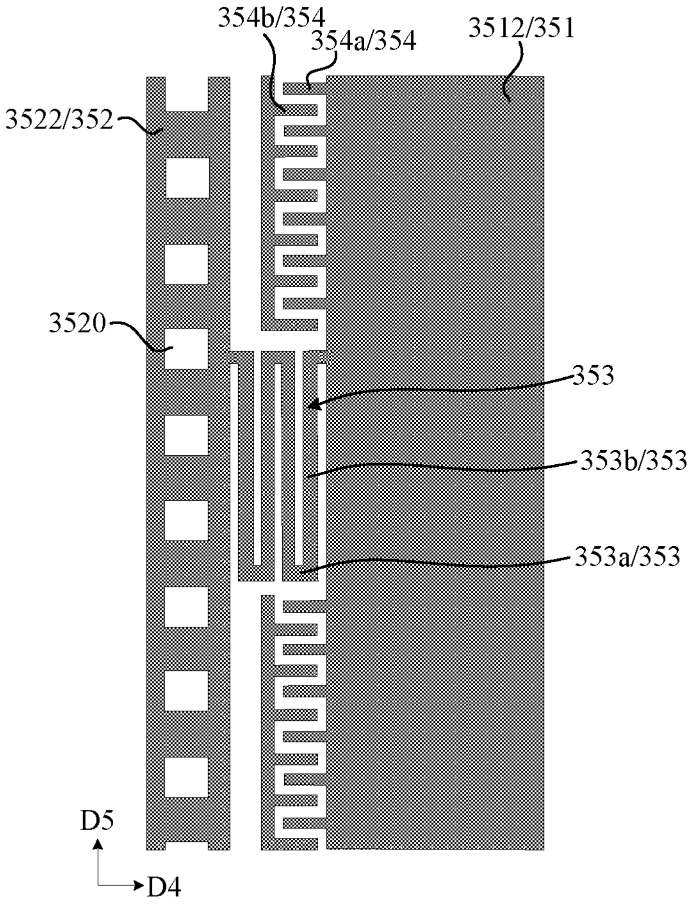
FIG. 8B is a schematic diagram of edge ground traces in FIG. 8A.
Figure 9:
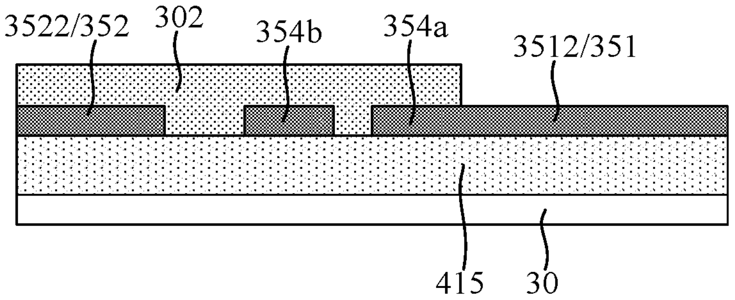
FIG. 9 is a partial cross-sectional view along Q-Q' direction in FIG. 8A.
Figure 10:
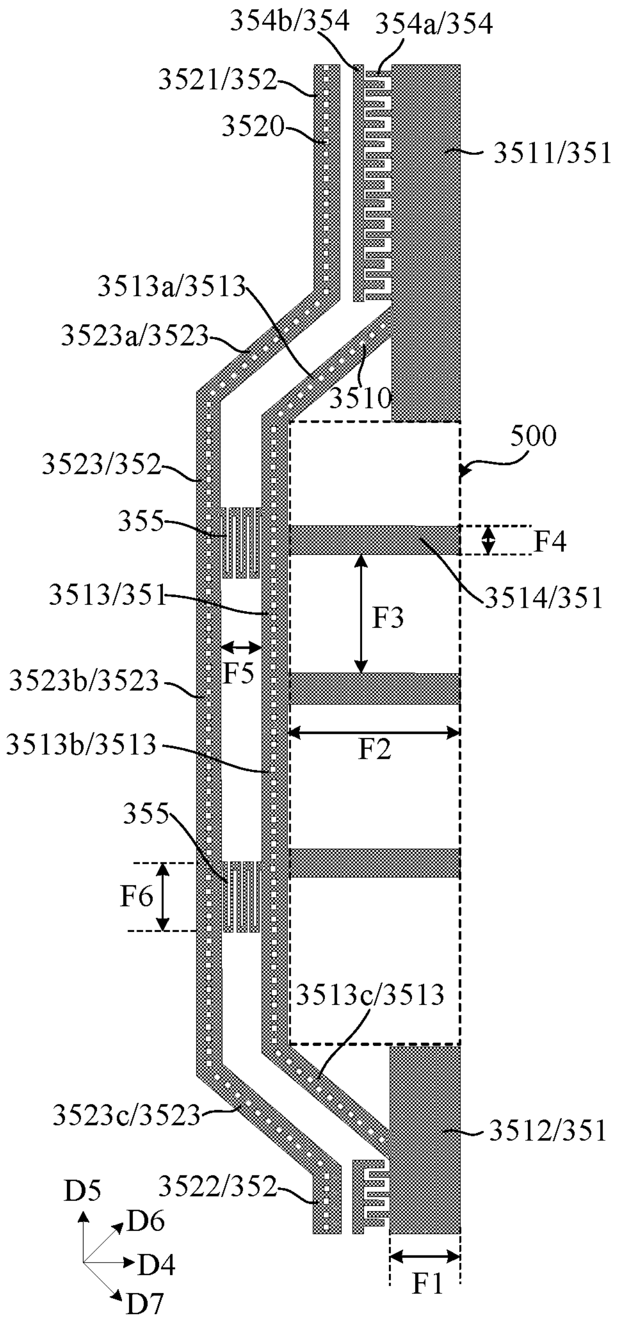
FIG. 10 is a partial plan view of edge ground traces of a region S3 in FIG. 6.
Figure 11:
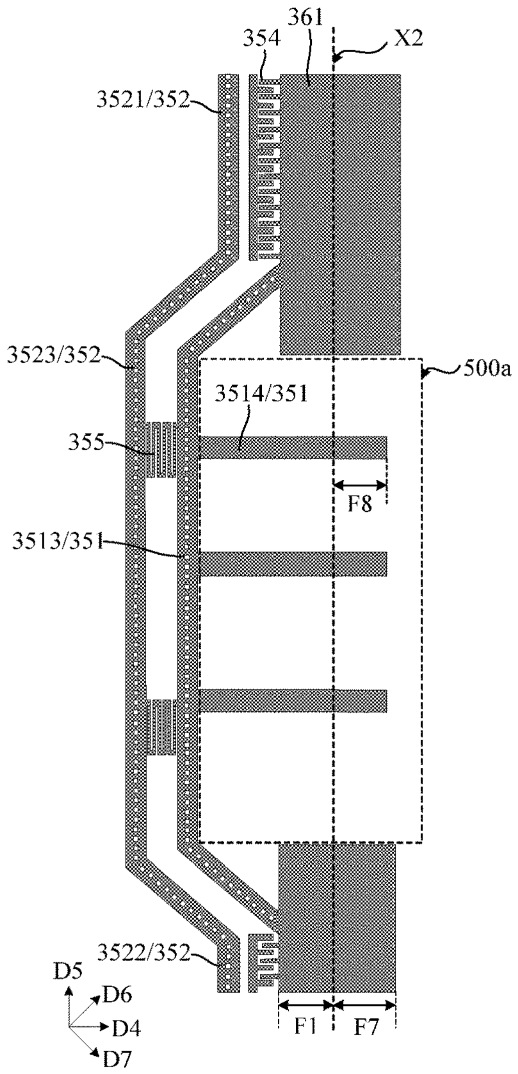
FIG. 11 is partial plan view of the region S3 in FIG. 6 before it is subjected to fine cutting according to a second cutting path X2.

FIG. 8A is a partial plan view of the region S2 in FIG. 6. FIG. 8B is a schematic diagram of the edge ground traces of FIG. 8A. FIG. 9 is a partial cross-sectional view along Q-Q' direction in FIG. 8A. FIG. 8A and FIG. 8B show partial structures of edge ground traces in a non-antenna projection region. FIG. 10 is a partial plan view of the edge ground traces of the region S3 in FIG. 6. FIG. 11 is partial plan view of the region S3 in FIG. 6 before it is not subjected to fine cutting according to a second cutting path X2. FIG. 10 shows a structure of edge ground traces in an antenna projection region and an adjacent non-antenna projection region. The dotted line in FIG. 10 identifies a region as an antenna projection region 500, and the region shown outside the antenna projection region 500 is the non-antenna projection region. The region 500*a* in FIG. 11 may be a projection region corresponding to the antenna structure on the display motherboard. In some examples, the antenna structure may be assembled with the display panel after the display motherboard has been cut to obtain the display panel. This embodiment is not limited thereto.

In some examples, as shown in FIG. 8A, FIG. 8B, FIG. 10, and FIG. 11, the edge ground traces 35 may include an outer ring trace 351 and an inner ring trace 352. The outer ring trace 351 may be located on a side of the inner ring trace 352 away from the active region. An edge of the outer ring trace 351 away from the inner ring trace 352 may be obtained after being cut according to the second cutting line X2. The outer ring trace 351 may include outer ring trace segments (e.g. outer ring trace segments 3511 and 3512) located in the non-antenna projection region, an outer ring connection segment 3513 connected to adjacent outer ring trace segments, and an outer ring extension segment 3514 which is at least partially located in the antenna projection region 500. The inner ring trace 352 may include inner ring trace segments (e.g. inner ring trace segments 3521 and 3522) located in the non-antenna projection region and an inner ring connection segment 3523 connected with adjacent inner ring trace segments.

In some examples, as shown in FIG. 8A and FIG. 8B, the outer ring trace segment 3512 of the outer ring trace 351 and the inner ring trace segment 3522 of the inner ring trace 352 may be electrically connected to each other through a plurality of first connection traces 353. The plurality of first connection traces 353 may be located between the outer ring trace segment 3512 of the outer ring trace 351 and the inner ring trace segment 3522 of the inner ring trace 352. A single first connection trace 353 has one end electrically connected to the outer ring trace segment 3512 of the outer ring trace 351, and has the other end electrically connected to the inner ring trace segment 3522 of the inner ring trace 352. The outer ring trace segment 3512 of the outer ring trace 351, the inner ring trace segment 3522 of the inner ring trace 352, and the plurality of first connection traces 353 may be of an integral structure.

In some examples, as shown in FIG. 8A and FIG. 8B, a plurality of first openings 3520 may be formed on the inner ring trace segment 3522 of the inner ring trace 352. The plurality of first openings 3520 may be arranged in one column along the fourth direction D4. The plurality of first openings 3520 may be arranged sequentially along the fifth direction D5 perpendicular to the fourth direction D4. In some examples, an orthographic projection of the first openings 3520 on the base substrate may be rectangular. For example, a size of a first opening 3520 may be substantially the same as a dimension of a sub-pixel of the active region, and a spacing between adjacent first opening 3520 may be substantially the same as a spacing between adjacent sub-pixels of the active region. For example, a dimension of the orthographic projection of the first opening 3520 on the base substrate may be about 5 microns ×5 microns. However, this embodiment is not limited thereto. For example, the orthographic projection of the first openings on the base substrate may be in another shape, such as a circle or an ellipse. For another example, the plurality of first openings may be arranged in a plurality of columns (e.g., two or three columns) along the fourth direction. In this example, by providing the first openings on the inner ring trace segment, a direct contact area between the edge ground traces and the second touch insulation layer can be reduced, thereby reducing a risk of peeling of film layers.

In some examples, as shown in FIG. 8A and FIG. 8B, a resistance of a single first connection trace 353 may be about 10 ohms to 20 ohms, which may be, for example, about 10 ohms. An orthographic projection of the first connection trace 353 on the base substrate may be a zigzag trace. For example, a single first connection trace 353 may include a plurality of first extension segments 353*a* and second extension segments 353*b* which are connected sequentially. The first extension segments 353*a* may extend along the fourth direction D4, and the second extension segments 353*b* may extend along the fifth direction D5. The second extension segments 353*b*, the first extension segments 353*a* and the second extension segment 353*b* which are connected sequentially may form a circuitry. A plurality of circuitries may be arranged sequentially along the fourth direction D4. A single first connection trace 353 may include a plurality of circuitries. For example, the number of circuitries of a single first connection trace 353 may be about 3 to 5. As shown in FIG. 8B, a single first connection trace 353 may include three circuitries. In some examples, a length of a first extension segment 353*a* (i.e. a length in the fourth direction D4) may be less than a length of a second extension segment 353*b* (i.e. a length in the fifth direction D5). A width of the first extension segment 353*a* (i.e. a length in the fifth direction D5) may be substantially the same as a width of the second extension segment 353*b* (i.e. a length in the fourth direction D4). For example, the width of the first extension segment 353*a* may be about 3 microns to 5 microns, which may be, for example, about 5 microns. A pitch between adjacent second extension segments 353*b* may be about 3 microns to 5 microns, which may be, for example, about 5 microns. A pitch between a second extension segment 353*b* and an outer ring trace segment 3512 of an adjacent outer ring trace 351, and a pitch between the second extension segment 353*b* and an inner ring trace segment 3522 of an adjacent inner ring trace 352 may be substantially the same as a pitch between the adjacent second extension segments 353*b*. However, this embodiment is not limited thereto. For example, a length of the first extension segment of the first connection trace may be greater than a length of the second extension segment, and the first extension segment, the second extension segment, and the first extension which are connected sequentially may form one circuitry, a plurality of which may be arranged sequentially along the fifth direction. In this exemplary embodiment, the first connection trace is configured to electrically connect the outer ring trace segment of the outer ring trace and the inner ring trace segment of the inner ring trace, and the length of the first connection trace is extended by back several times of bending, so that the ground resistance may be increased, thereby increasing the resistance of the edge ground traces and improving an electrostatic protection effect.

In some examples, as shown in FIG. 8A and FIG. 8B, a plurality of anti-static capacitors 354 may be arranged between the outer ring trace segment 3512 of the outer ring trace 351 and the inner ring trace segment 3522 of the inner ring trace 352. The anti-static capacitors 354 may be arranged within a spacing between adjacent first connection traces 353. At least one anti-static capacitor 354 may include a first plate 354*a* and a second plate 354*b*. The first plate 354*a* and the outer ring trace segment 3512 of the outer ring trace 351 may be of an integral structure. The second plate 354*b* may be located on a side of the first plate 354*a* close to the inner ring trace segment 3522 of the inner ring trace 352. The first plate 354*a* may be grounded, and the second plate 354*b* may be a dummy conductive structure. In this example, the outer ring trace segment 3512 of the outer ring trace 351, the inner ring trace segment 3522 of the inner ring trace 352, the first connection traces 353, and the first plate 354*a* of the anti-static capacitor 354 may be of an integral structure. The first plate 354*a* may have a plurality of first comb portions facing the second plate 354*b*, and the second plate 354*b* may have a plurality of second comb portions facing the first plate 354*a*. A plurality of first comb portions and second comb portions may be interspersed with each other. In this way, an overlapping area between the two plates may be increased in a limited space, and a capacitance pitch may be reduced, thus increasing the capacitance. However, this embodiment is not limited thereto. In this example, by arranging the anti-static capacitors between the inner ring trace segment of the inner ring trace and the outer ring trace segment of the outer ring trace, the anti-static capacitor may be charged when instantaneous high-voltage static electricity passes, which plays a role in dividing voltage and improves a risk of electrostatic breakdown.

In some examples, as shown in FIG. 10, the outer ring trace segments 3511 and 3512 may be located on opposite sides of the antenna projection region 500 along the fifth direction D5. The structures of the outer ring trace segment 3511 and the inner ring trace segment 3521 can be referred to as the structures between the outer ring trace segment 3512 and the inner ring trace segment 3522, and thus will not be repeated here.

In some examples, as shown in FIG. 10 and FIG. 11, a distance between the inner ring trace segment 3521 (or 3522) of the inner ring trace 352 and the second cutting path X2 may be less than a distance between the inner ring connection segment 3523 and the second cutting path X2. In FIG. 11, the position where the second cutting path X2 is located may form the right edge of the display panel.

In some examples, as shown in FIG. 10, the antenna projection region 500 of the display panel may be rectangular, and the antenna projection region 500 may include an upper edge, a lower edge, a left edge and a right edge. The upper edge and the lower edge of the antenna projection region 500 may be substantially parallel, which may extend, for example, along the fourth direction D4, and the left edge and right edge may be substantially parallel, which may extend, for example, along the fifth direction D5. The left edge of the antenna projection region 500 may be located on a side of the right edge close to the active region. The right edge of the antenna projection region 500 may be flush with the right edge of the base substrate of the display panel.

In some examples, as shown in FIG. 10, the inner ring connection segment 3523 is connected between the inner ring trace segments 3521 and 3522. The inner ring connection segment 3523, and the inner ring trace segments 3521 and 3522 may be of an integral structure. In the region S3, the inner ring trace segments 3521 and 3522 of the inner ring trace 352 may extend along the fifth direction D5, and the inner ring connection segment 3523 may be retracted inwardly along the opposite direction of the fourth direction D4, i.e. retracted towards a side close to the active region, so as to bypass the antenna projection region 500.

In some examples, as shown in FIG. 10, the inner ring connection segment 3523 may include a first connection segment 3523*a*, a second connection segment 3523*b*, and a third connection segment 3523*c* which are connected sequentially. The first connection segment 3523*a* may be connected to the inner ring trace segment 3521, and the third connection segment 3523*c* may be connected to the inner ring trace segment 3522. The second connection segment 3523*b* is connected between the first connection segment 3523*a* and the third connection segment 3523*c*. The first connection segment 3523*a* may extend along a sixth direction D6, the second connection segment 3523*b* may extend along the fifth direction D5, and the third connection segment 3523*c* may extend along a seventh direction D7. A clockwise angle between the first connection segment 3523*a* and the second connection segment 3523*b* may be greater than 90 degrees and less than 180 degrees, and a clockwise angle between the second connection segment 3523*b* and the third connection segment 3523*c* may be greater than 90 degrees and less than 180 degrees. Among them, the sixth direction D6 may intersect with the fifth direction D5 and the fourth direction D4, and the seventh direction D7 may intersect with all of the fourth direction D4, the fifth direction D5 and the sixth direction D6, for example, the sixth direction D6 may be perpendicular to the seventh direction D7. However, this embodiment is not limited thereto. In some other examples, the first connection segment 3523*a* and the third connection segment 3523*c* may both extend along the fourth direction D4, such that the clockwise angle between the first connection segment 3523*a* and the second connection segment 3523*b* may be about 90 degrees, and the clockwise angle between the second connection segment 3523*b* and the third connection segment 3523*c* may be about 90 degrees.

In some examples, as shown in FIG. 10, the first connection segment 3523*a*, the second connection segment 3523*b*, and the third connection segment 3523*c* of the inner ring connection segment 3523 may all be straight line segments. However, this embodiment is not limited thereto. In some other examples, the first connection segment and third connection segment of the inner ring connection segment may be broke line segments or arc segments.

In some examples, as shown in FIG. 10, a width of the inner ring connection segment 3523 and a width of the inner ring trace segment 3521 (or 3522) may be substantially the same. The inner ring connection segment 3523 may be provided with a plurality of first openings 3520. The plurality of first openings 3520 may be arranged in one column along the fourth direction D4. An arrangement mode of the first opening in the inner ring connection segment may be the same as an arrangement mode of the first openings on the inner ring trace segment, and thus will not be repeated here. However, this embodiment is not limited thereto. In some other examples, the number of columns of first openings provided on the inner ring trace segment may be greater than the number of columns of first openings provided on the inner ring connection segment. For example, the plurality of first openings of the inner ring trace segment may be arranged in a plurality of columns, and the plurality of first openings of the inner ring connection segment may be arranged in one column.

In some examples, as shown in FIG. 10 and FIG. 11, a distance between the outer ring trace segment 3511 (or 3512) of the outer ring trace 351 and the second cutting path X2 may be less than a distance between the outer ring connection segment 3523 and the second cutting path X2. Edges of the outer ring trace segments 3511 and 3512 away from the active region are obtained by being cut according to the second cutting path X2.

In some examples, as shown in FIG. 10, the outer ring connection segment 3513 is connected between the outer ring trace segments 3511 and 3512. The outer ring connection segment 3513, and the outer ring trace segments 3511 and 3512 may be of an integral structure. In the region S3, the outer ring trace segments 3511 and 3512 of the outer ring trace 351 may extend along the fifth direction D5, and the outer ring connection segment 3513 may be retracted inwardly along the opposite direction of the fourth direction D4, i.e. retracted towards a side close to the active region, to bypass the antenna projection region 500, so that the outer ring connection segment 3523 of the outer ring trace 351 is located on a side of the antenna projection region 500 close to the inner ring trace 352.

In some examples, as shown in FIG. 10, the outer ring connection segment 3513 may include a fourth connection segment 3513*a*, a fifth connection segment 3513*b*, and a sixth connection segment 3513*c* which are connected sequentially. The fourth connection segment 3513*a* may be connected to the outer ring trace segment 3511, and the sixth connection segment 3513*c* may be connected to the outer ring trace segment 3512. The fifth connection segment 3513*b* is connected between the fourth connection segment 3513*a* and the sixth connection segment 3513*c*. The fourth connection segment 3513*a* may extend along the sixth direction D6, the fifth connection segment 3513*b* may extend along the fifth direction D5, and the sixth connection segment 3513*c* may extend along the seventh direction D7. A clockwise angle between the fourth connection segment 3513*a* and the fifth connection segment 3513*b* may be greater than 90 degrees and less than 180 degrees, and a clockwise angle between the fifth connection segment 3513*b* and the sixth connection segment 3513*c* may be greater than 90 degrees and less than 180 degrees. However, this embodiment is not limited thereto. In some other examples, the fourth connection segment 3513*a* and the sixth connection segment 3513*c* may both extend along the fourth direction D4, such that the clockwise angle between the fourth connection segment 3513*a* and the fifth connection segment 3513*b* may be about 90 degrees, and the clockwise angle between the fifth connection segment 3513*b* and the sixth connection segment 3513*c* may be about 90 degrees.

In some examples, as shown in FIG. 10, the fourth connection segment 3513*a*, the fifth connection segment 3513*b*, and the sixth connection segment 3513*c* of the outer ring connection segment 3513 may all be straight line segments. However, this embodiment is not limited thereto. In some other examples, the fourth connection segment and sixth connection segment of the outer ring connection segment may be broke line segments or arc segments. In this example, a trace form of the outer ring connection segment 3513 may be similar to a trace form of the inner ring connection segment 3523. However, this embodiment is not limited thereto.

In some examples, as shown in FIG. 10, a width of the outer ring connection segment 3513 may be less than a width of the outer ring trace segment 3511 (or 3512). A width of the outer ring connection segment 3513 may be substantially the same as a width of the inner ring connection segment 3523. For example, the width of the outer ring connection segment 3513 and the width of the inner ring connection segment 3523 may be about 15 microns to 25 microns, which may be, for example, about 20 microns. In this example, by providing the width of the outer ring connection segment and the width of the inner ring connection segment to be approximately the same, both electrical connection between adjacent outer ring trace segments and electrical connection between adjacent inner ring trace segments can be ensured, and space occupation can also be avoided.

In some examples, as shown in FIG. 10, a plurality of second openings 3510 may be provided on the outer ring connection segment 3513. The plurality of second openings 3510 may be arranged in one column along the fourth direction D4. A structure of the second openings 3510 may be referred to as the structure of the first openings 3520, and the arrangement mode of the second openings 3510 on the outer ring connection segment 3513 may be the same as the arrangement mode of the first openings on the inner ring connection segment, and thus will not be repeated here. However, this embodiment is not limited thereto. In some other examples, the number of columns of first openings provided on the inner ring connection segment may be different from the number of columns of second openings provided on the outer ring connection segment.

In some examples, as shown in FIG. 10, one end of each of the plurality of outer ring extension segments 3514 of the outer ring trace 351 is connected to the outer ring connection segment 3513, and the other end may extend to an edge of the base substrate along the fourth direction D4. A plurality of outer ring extension segments 3514 and outer ring connection segments 3513 may be connected to form a comb-like structure. A plurality of outer ring extension segments 3514 may be arranged sequentially between outer ring trace segments 3511 and 3512 along the fifth direction D5. Shapes and dimensions of the plurality of outer ring extension segments 3514 may be substantially the same. For example, an orthographic projection of a single outer ring extension segment 3514 on the base substrate may be rectangular. However, this embodiment is not limited thereto. In some other examples, the shapes or dimensions of the plurality of outer ring extension segments may be different.

In some examples, as shown in FIG. 10, a width F1 of the outer ring trace segment 3511 (or 3512) of the outer ring trace 351 may be about 50 microns to 70 microns, which may be, for example, about 60 microns. A distance F2 between the outer ring connection segment 3513 of the outer ring trace 352 and an edge of the display panel may be about 130 microns to 170 microns, which may be, for example, about 150 microns. A distance F3 between adjacent outer ring extension segments 3514 may be about 1500 microns to 2300 microns, which may be, for example, about 2000 microns. A distance between an outer ring extension segment 3514 and an adjacent outer ring trace segment 3511 (or 3512) may be approximately the same as a distance between the adjacent outer ring extension segments. A length of at least one outer ring extension segment 3514 along the fourth direction D4 may be substantially the same as a distance between the outer ring connection segment 3513 and the edge of the display panel. A length F4 of at least one outer ring extension segment 3514 along the fifth direction D5 may be about 130 microns to 170 microns, which may be, for example, about 150 microns. A distance F5 between the outer ring connection segment 3513 of the outer ring trace 351 and the inner ring connection segment 3523 of the inner ring trace 352 may be about 30 microns to 40 microns, which may be, for example, about 35 microns. However, this embodiment is not limited thereto.

In some examples, as shown in FIG. 11, the outer ring trace segment may be obtained by cutting off a portion of an outer ring metal layer 361 along the second cutting path X2, and the outer ring extension segments 3514 may be obtained by cutting off a portion of the outer ring metal layer 361 along the second cutting path X2. Among them, a width F7 of the portion of the outer ring metal layer 361 which is cut off to form the outer ring trace segment may be about 60 microns to 80 microns, which may be, for example, about 70 microns. A width F8 of the portion of the outer ring metal layer 361 which is cut off to form the outer ring extension segment may be about 50 microns to 70 microns, which may be, for example, about 60 microns.

In some examples, as shown in FIG. 10, the fifth connection segment 3513*b* of the outer ring connection segment 3513 and the second connection segment 3523*b* of the inner ring connection segment 3523 may be electrically connected through a plurality of second connection traces 355. Only two second connection traces 355 are illustrated in FIG. 11A. The plurality of second connection traces 355 may be located between the outer ring connection segment 3513 of the outer ring trace 351 and the inner ring connection segment 3523 of the inner ring trace 352. A single second connection trace 355 has one end electrically connected to the outer ring connection segment 3513 of the outer ring trace 351, and has the other end electrically connected to the inner ring connection segment 3523 of the inner ring trace 352. The outer ring connection segment 3513 of the outer ring trace 351, the inner ring connection segment 3523 of the inner ring trace 352 and the plurality of second connection traces 355 may be of an integral structure. A resistance of the single second connection trace 355 and a resistance of a single first connection trace 353 may be approximately the same, which may be, for example, about 10 ohms. By arranging the resistances of the second connection trace and the first connection trace to be approximately the same, uniformity of the effect of leading out the electrostatic around the display panel can be ensured.

In some examples, as shown in FIG. 10, an orthographic projection of the second connection trace 355 on the base substrate may be a zigzag trace. A length F6 of the second connection trace 355 along the fifth direction D5 may be about 120 microns to 150 microns, which may be, for example, about 135 microns. In this exemplary embodiment, the second connection trace is configured to electrically connect the outer ring connection segment of the outer ring trace and the inner ring connection segment of the inner ring trace, and a length of the second connection trace is extended by several times of bending, so that the ground resistance may be increased, thereby increasing the resistance of the edge ground traces and improving an electrostatic protection effect.

In some examples, the number of the first connection traces 353 and that of the second connection traces 355 may be matched according to the number of total resistance and capacitance of the edge ground traces to avoid providing too many connection traces, which leads to introduction of external charges due to too small parallel resistance, invalidating an Electric-Static Discharge (ESD for short) test, or providing too few connection traces, which leads to the circuit being burned out and invalid by an instantaneous ESD surge current due to process risk. In some examples, the total number of first connection traces and second connection traces may be less than or equal to 40. For example, the total number of the first connection traces and the second connection traces may be about 20 to 40, such as about 6, 19 or 40.

Figure 12:
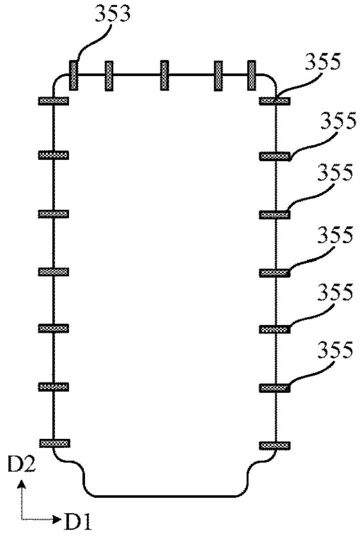
FIG. 12 is a schematic diagram of an arrangement of connection traces according to at least one embodiment of the present disclosure.

FIG. 12 is a schematic diagram of an arrangement of connection traces according to at least one embodiment of the present disclosure. In some examples, as shown in FIG. 12, the edge ground traces may include nineteen connection traces. The nineteen connection traces may be arranged in the upper, left and right edge regions, respectively. Among them, five first connection traces 353 may be arranged in the upper edge region, seven first connection traces 353 may be arranged in the left edge region, respectively, and one first connection trace 353 and six second connection traces 355 may be arranged in the right edge region, respectively. However, this embodiment is not limited thereto. For example, the upper, left and right edge regions may have two connection traces, respectively. For another example, 10 connection traces may be arranged in the upper edge region, and 15 connection traces may be arranged in the left edge region and the right edge region, respectively.

In some examples, arrangement positions of the connection traces in the left edge region and right edge region may be symmetrical with respect to a centerline of the display panel in the first direction D1, and the arrangement positions of the connection traces in the upper edge region may be symmetrical with respect to the centerline of the display panel in the first direction D1. However, this embodiment is not limited thereto. In this exemplary implementation, by controlling the number of connection traces, it is possible to increase the resistance of the edge ground traces and reduce a risk of electrostatic breakdown of adjacent metal film layers.

In some examples, as shown in FIG. 9, an orthographic projection of the second touch insulation layer 302 on the base substrate 30 may be partially overlapped with an orthographic projection of the edge ground traces on the base substrate 30. For example, the second touch insulation layer 302 may cover the inner ring trace 352, and not cover the outer ring trace 351. The edge of the second touch insulation layer 302 may be overlapped with the anti-static capacitor 354. In this example, by using a perforated design on the outer ring connection segment 3512 between the inner ring trace 352 and the outer ring trace 351, it is possible to avoid the edge ground traces from being in direct contact with the second touch insulation layer 302 over a large area, and it is possible to avoid peeling of the film layer.

In some examples, as shown in FIG. 10, the overlapping area between the edge ground traces and the antenna projection region 500 may be less than or equal to 7% of the total region of the antenna projection region 500. In this example, a proportion of an overlapping area between a plurality of outer ring extension segments of the outer ring trace and the antenna projection region in the antenna projection region may be less than 7%. In some examples, a proportion of the overlapping area between the edge ground traces and the antenna projection region in the antenna projection region may be less than a proportion of the overlapping area between the edge ground traces and the non-antenna projection region to the non-antenna projection region. By controlling the area of the edge ground traces in the antenna projection region, an interference effect on the antenna structure can be reduced and the effect of leading out of the electrostatic can be ensured.

Figure 13:
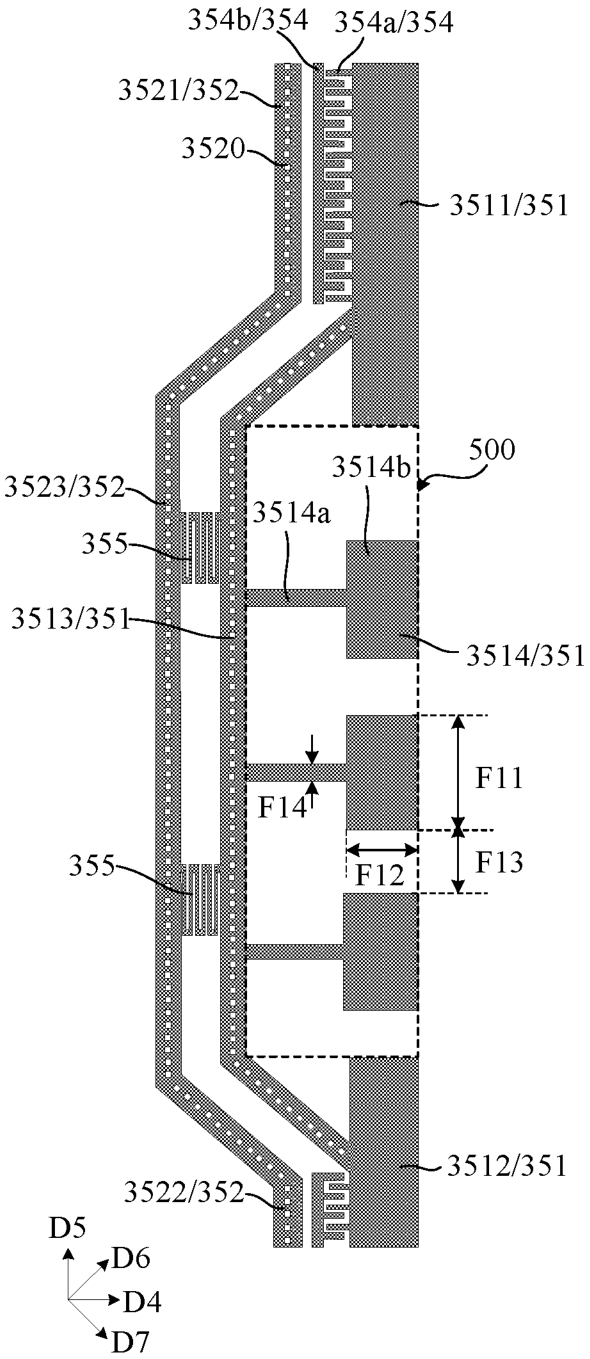
FIG. 13 is another partial plan view of the edge ground traces of the region S3 in FIG. 6.

FIG. 13 is another partial plan view of the edge ground traces of the region S3 in FIG. 6. In some examples, as shown in FIG. 13, an orthographic projection of an outer ring extension segment 3514 of the outer ring trace 351 on the base substrate may be T-shaped. A single outer ring extension segment 3514 may include a first outer ring extension portion 3514*a* and a second outer ring extension portion 3514*b* connected to each other. The first outer ring extension portion 3514*a* may be located on a side of the second outer ring extension portion 3514*b* close to the inner ring trace 352. The first outer ring extension portion 3514*a* may be electrically connected to the outer ring connection segment 3513. The second outer ring extension portion 3514*b* has one end electrically connected to the firstouter ring extension portion 3514*a*, and the other end extending to an edge of the display panel. A length of the first outer ring extension portion 3514*a* along the fifth direction D5 may be smaller than a length of the second outer ring extension portion 3514*b* along the fifth direction D5. In this example, by providing a T-shaped outer ring extension segment, a larger length of the outer ring extension segment can be retained along the edge of the display panel, thereby facilitating leading out of edge charges of the display panel.

In some examples, as shown in FIG. 13, a length F14 of the first outer ring extension portion 3514*a* along the fifth direction D5 may be about 130 microns to 170 microns, which may be, for example, about 150 microns. A distance F13 between adjacent second outer ring extension portions 3514*b* may be about 900 microns to 1100 microns, which may be, for example, about 1000 microns. A length of the second outer ring extension portion 3514*b* along the fourth direction D4 may be approximately the same as a width of the outer ring trace segment 3511. For example, the length F12 of the second outer ring extension portion 3514*b* along the fourth direction D4 may be about 50 microns to 70 microns, which may be, for example, about 60 microns, and a length F11 along the fifth direction D5 may be about 1000 microns to 1300 microns, which may be, for example, about 1150 microns.

The remaining structures of the edge ground traces of this embodiment may be described with reference to the foregoing embodiments, and thus will not be described here.

Figure 14:
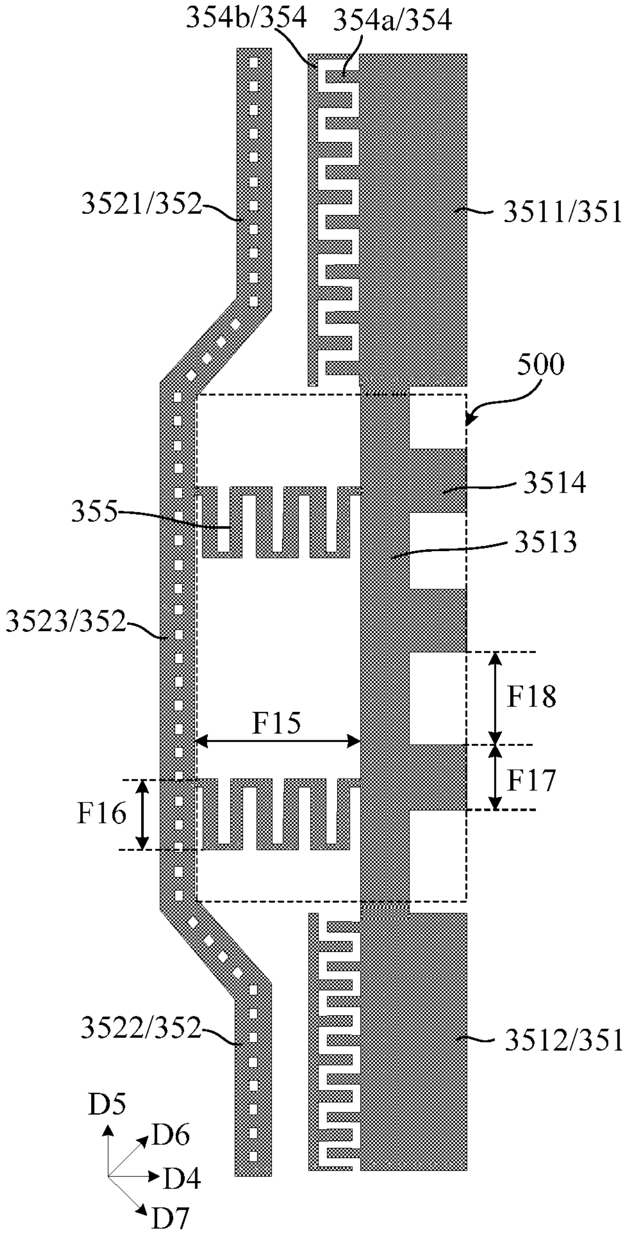
FIG. 14 is another partial plan view of the edge ground traces of the region S3 in FIG. 6.

FIG. 14 is another partial plan view of the edge ground traces of the region S3 in FIG. 6. In some examples, as shown in FIG. 14, outer ring trace may include outer ring trace segments (e.g. outer ring trace segments 3511 and 3512) located in non-antenna projection region, an outer ring connection segment 3513 at least partially located in antenna projection region 500, and a plurality of outer ring extension segments 3514 located in antenna projection region 500.

In some examples, as shown in FIG. 14, the outer ring connection segment 3513 may extend along the fifth direction D5. In the region S3, the outer ring connection segment 3513 may be a straight line segment. In some other examples, the outer ring connection segment may be a broke line segment or a curve segment. A pitch F15 between the outer ring connection segment 3513 and the inner ring connection segment 3523 may be about 80 microns to 100 microns, which may be, for example, 90 microns. A width of the outer ring connection segment 3513 and a width of the inner ring connection segment 3523 may be substantially the same, which may, for example, about 20 microns. A distance between a side of the outer ring connection segment 3513 away from an edge of the display panel and the edge of the display panel may be substantially the same as a distance between a side of the outer ring trace segment 3511 (or 3512) away from the edge of the display panel. In other words, the side of the outer ring connection segment 3513 away from the edge of the display panel may be substantially flush with the side of the outer ring trace segment 3511 (or 3512) away from the edge of the display panel. However, this embodiment is not limited thereto.

In some examples, as shown in FIG. 14, each of the plurality of outer ring extension segments 3514 is connected to the outer ring connection segment 3513, and the other end may extend to the edge of the display panel. For example, a plurality of outer ring extension segments 3514 and outer ring connection segments 3513 may be connected to form a comb-like structure. For example, a length F17 of a single outer ring extension segment 3514 along the fifth direction D5 may be about 130 microns to 170 microns, which may be, for example, about 150 microns, and a spacing F18 between adjacent outer ring extension segments 3514 may be about 1800 microns to 2200 microns, which may be, for example, about 2000 microns. However, this embodiment is not limited thereto.

In some examples, as shown in FIG. 14, the outer ring connection segment 3513 and the inner ring connection segment 3523 may be electrically connected through a plurality of second connection traces 355. Only two second connection traces 355 are illustrated in FIG. 14. The plurality of second connection traces 355 may be located between the outer ring connection segment 3513 of the outer ring trace 351 and the inner ring connection segment 3523 of the inner ring trace 352. One end of a single second connection trace 355 is electrically connected to the outer ring connection segment 3513 of the outer ring trace 351, and the other end of the second connection trace 355 is electrically connected to the inner ring connection segment 3523 of the inner ring trace 352. The outer ring connection segment 3513 of the outer ring trace 351, the inner ring connection segment 3523 of the inner ring trace 352 and the plurality of second connection traces 355 may be of an integral structure. At least a portion of the single second connection trace 355 may be located in the antenna projection region 500. A resistance of the single second connection trace 355 and a resistance of a single first connection trace 353 may be approximately the same, which may be, for example, about 10 ohms. An orthographic projection of the second connection trace 355 on the base substrate may be a zigzag trace. A length F16 of the second connection trace 355 along the fifth direction D5 may be about 100 microns to 120 microns, which may be, for example, about 109 microns. In this exemplary embodiment, the second connection trace is configured to electrically connect the outer ring connection segment of the outer ring trace and the inner ring connection segment of the inner ring trace, and a length of the second connection trace is extended by several times of bending, so that the ground resistance may be increased, thereby increasing the resistance of the edge ground traces and improving an electrostatic protection effect.

The outer ring connection segment and the outer ring extension segments of the edge ground traces of this example are located in the antenna projection region, and an area of the edge ground traces located in the antenna projection region is smaller than an area of the edge ground traces located in the non-antenna projection region, so that antenna signals will not be shielded by metals over a large area, and moreover, the outer ring connection segment and the inner ring trace are electrically connected by the second connection traces, so that static electricity can be better led out and the static electricity damages caused in ESD test can be prevented.

The remaining structures of the edge ground traces of this embodiment may be described with reference to the foregoing embodiments, and thus will not be described here.

Figure 15:
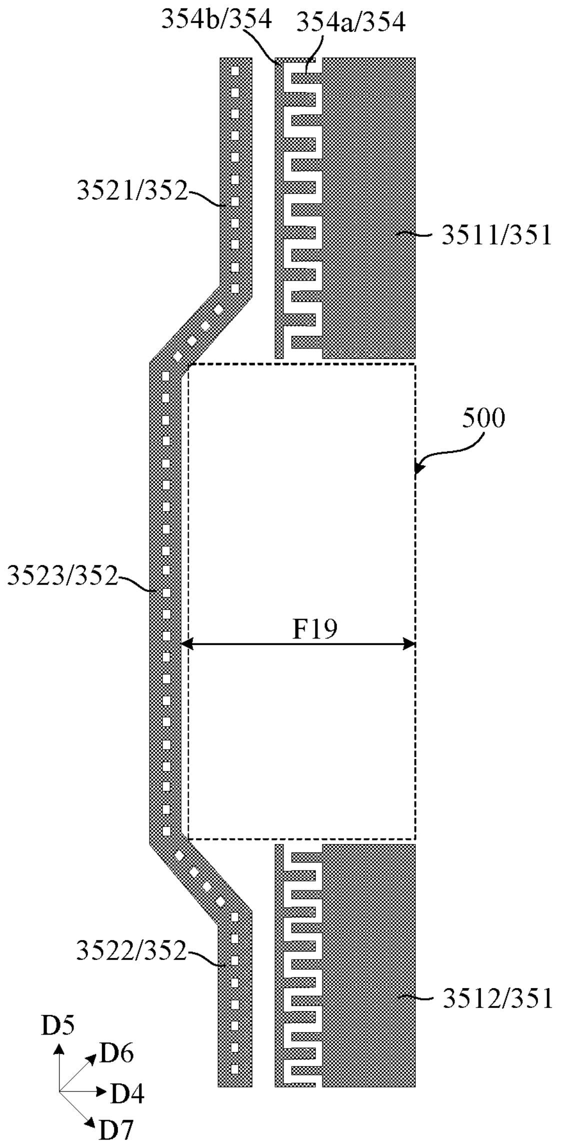
FIG. 15 is another partial plan view of the edge ground traces of the region S3 in FIG. 6.

FIG. 15 is another partial plan view of the edge ground traces of the region S3 in FIG. 6. In some examples, as shown in FIG. 15, the outer ring trace 351 may include outer ring trace segments 3511 and 3512 located in non-antenna projection region. In this example, the outer ring trace 351 is not overlapped with the antenna projection region 500, and the outer ring trace segments 3511 and 3512 of the outer ring trace 351 may be disconnected in the antenna projection region 500. A distance F19 between the inner ring connection segment 3523 of the inner ring trace 352 and an edge of the display panel may be about 40 microns to 50 microns, which may be, for example, about 45 microns. The antenna projection region is avoided by inwardly retracting a side of the inner ring trace 352 towards the active region side. In this example, the inner ring trace is retracted inwardly for avoiding the antenna projection region and the outer ring trace is disconnected for avoiding the antenna projection region, so that there is no metal film layer in the antenna projection region, and the edge ground traces are not overlapped with the antenna projection region, thereby reducing the shielding and interference of the edge ground traces to antenna signals and ensuring the performance of the antenna structure. In the non-antenna projection region, the inner ring trace 352 and the outer ring trace 351 may be electrically connected through the first connection traces, thereby ensuring that negative charges generated on the surface of the cover plate of the display panel may be led out, blocking the electrostatic conduction path, reducing the negative electric field formed inside the display panel, and improving the illumination of the display structure layer due to the negative electric field.

The remaining structures of the edge ground traces of this embodiment may be described with reference to the foregoing embodiments, and thus will not be described here.

Figure 16:
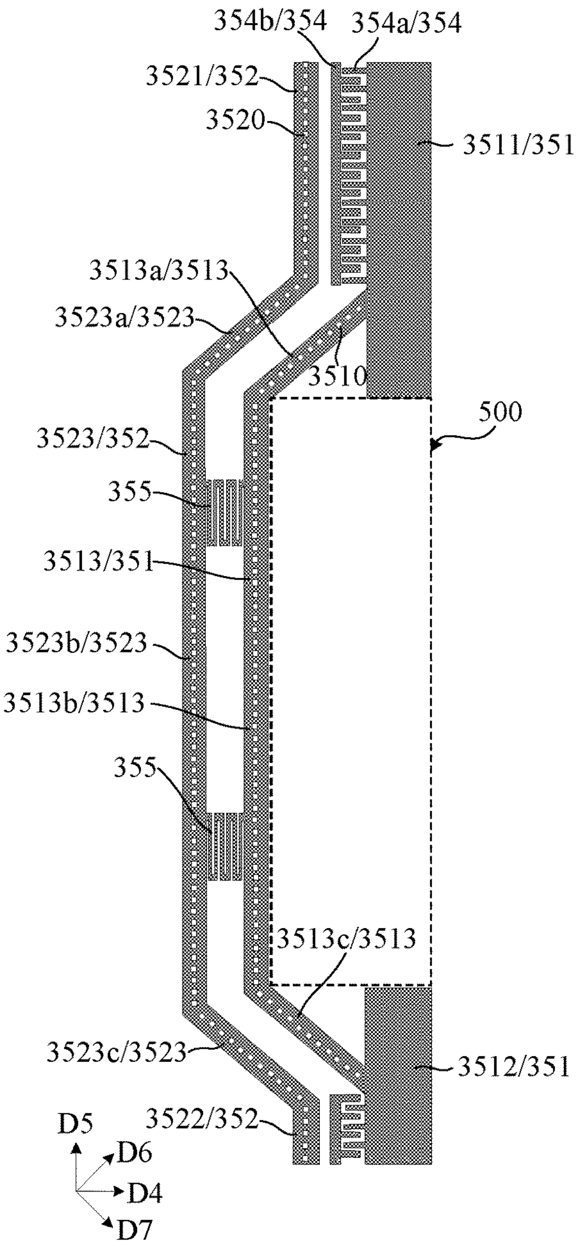
FIG. 16 is another partial plan view of the edge ground traces of the region S3 in FIG. 6.

FIG. 16 is another partial plan view of the edge ground traces of the region S3 in FIG. 6. In some examples, as shown in FIG. 16, the outer ring trace 351 may include outer ring trace segments (e.g. outer ring trace segments 3511 and 3512) and an outer ring connection segment 3513 connected to adjacent outer ring trace segments. The outer ring trace segments 3511 and 3512, and the outer ring connection segment 3513 may be located in the non-antenna projection region. In this example, the outer ring trace 351 is not overlapped with the antenna projection region 500, and the outer ring trace segments 3511 and 3512 of the outer ring trace 351 may be disconnected in the antenna projection region 500, which are connected through the outer ring connection segment 3513 of the non-antenna projection region. A width of the outer ring connection segment 3513 may be smaller than a width of an outer ring trace segment, and may be substantially the same as a width of the inner ring connection segment 3523. The outer ring connection segment 3513 and the inner ring connection segment 3523 may be electrically connected through the plurality of second connection traces 355.

In this example, the inner ring trace and the outer ring trace are retracted inwardly for avoiding, so that there is no metal film layer in the antenna projection region, and the edge ground traces are not overlapped with the antenna projection region, thereby reducing the shielding and interference of the edge ground traces to antenna signals and ensuring the performance of the antenna structure. In the non-antenna projection region, the inner ring trace and the outer ring trace may be electrically connected through the first connection trace and the second connection trace, thereby ensuring that negative charges generated on the surface of the cover plate of the display panel can be led out, blocking the electrostatic conduction path, reducing the negative electric field formed inside the display panel, and improving the illumination of the display structure layer due to the negative electric field.

The remaining structures of the edge ground traces of this embodiment may be described with reference to the foregoing embodiments, and thus will not be described here.

In the display panel according to this embodiment, by arranging edge ground traces and making the edge ground traces partially or completely avoid the antenna projection region, the shielding and interference of the display panel to antenna signals may be reduced on the basis of ensuring that the negative charges generated on the surface of the cover plate of the display panel are led out to ensure the display effect of the display panel, thereby ensuring the performance of the antenna structure.

The present disclosure further provides a display panel, including a display panel and an antenna structure. The display panel includes an active region and an edge region located on at least one side of the active region. The edge region includes an antenna projection region and a non-antenna projection region located on at least one side of the antenna projection region. The active region of the display panel includes a base substrate, and a display structure layer and a touch structure layer arranged sequentially on the base substrate. The edge region of the display panel includes touch leads and edge ground traces which are arranged on the base substrate, wherein the edge ground traces are located on a side of the touch leads away from the active region. The touch leads and the edge ground traces are at least partially arranged on the same layer. An orthographic projection of the antenna structure on the display panel is overlapped with the antenna projection region of the display panel. An overlapping area between the edge ground traces and the antenna projection region is smaller than an overlapping area between the edge ground traces and the non-antenna projection region.

In some exemplary implementations, the antenna structure may be located on a side of the base substrate of the display panel away from the touch structure layer.

In some exemplary implementations, a portion of the edge ground traces located on a side of the antenna projection region close to the active region are first traces, and a portion of the edge ground traces located on a side of the non-antenna projection region close to the active region are second traces. A distance between an edge of a side of the first traces close to the active region and an edge of the base substrate is greater than a distance between an edge of a side of the second traces close to the active region and the edge of the base substrate.

The structure of the display panel according to this embodiment may be referred to descriptions of the aforementioned embodiments, and thus will not be repeated here.

In the display panel according to this embodiment, by arranging the edge ground traces on a side of the touch leads away from the active region and making the edge ground traces partially or completely avoid the antenna projection region, the shielding and interference of the display panel to the antenna signal can be reduced on the basis of ensuring that the negative charges generated on the surface of the cover plate of the display panel are led out to ensure the display effect of the display panel, thereby ensuring the performance of the antenna structure.

Figure 17:
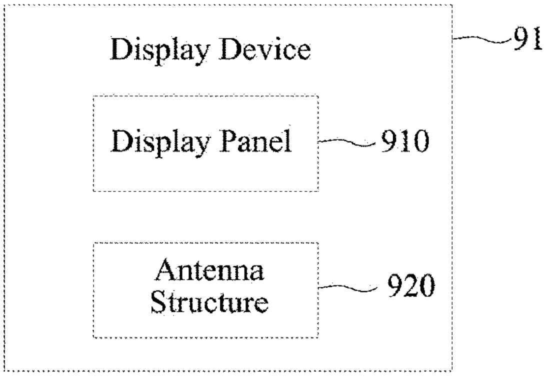
FIG. 17 is a schematic diagram of a display device according to at least one embodiment of the present disclosure.

FIG. 17 is a schematic diagram of a display device according to at least one embodiment of the present disclosure. As shown in FIG. 17, this embodiment provides a display device 91, including the display panel 910 of any of the aforementioned embodiments and an antenna structure 920. An orthographic projection of the antenna structure 920 on the display panel 910 may be overlapped with the antenna projection region of the display panel 910. In some examples, the display panel 910 may be an OLED display panel with an integrated touch structure. The display device 91 may be: any product or component with a display and touch function, such as a mobile phone, a tablet computer, a television, a display, a laptop, a digital photo frame, or a navigator. In some exemplary implementations, the display device 91 may be a wearable display device, for example, which may be worn on a human body in some manners. For example, the display device 91 may be a smart watch, a smart bracelet, and the like. However, this embodiment is not limited thereto.

The drawings of the present disclosure only involve structures involved in the present disclosure, and other structures may refer to conventional designs. The embodiments of the present disclosure and features in the embodiments may be combined to each other to obtain new embodiments if there is no conflict.

Those of ordinary skills in the art should understand that modifications or equivalent replacements may be made to the technical solutions of the present disclosure without departing from the essence and scope of the technical solutions of the present disclosure, and shall all fall within the scope of the claims of the present disclosure.

The invention claimed is:

1. A display panel, comprising: an active region and an edge region located on at least one side of the active region, wherein the edge region comprises an antenna projection region and a non-antenna projection region located on at least one side of the antenna projection region;

the active region comprises a base substrate, and a display structure layer and a touch structure layer arranged on the base substrate sequentially;

the edge region comprises an isolation dam and edge ground traces which are arranged on the base substrate; the edge ground traces are located on a side of the isolation dam away from the active region, wherein the edge region comprises a first sub-edge region, a second sub-edge region and a third sub-edge region along a direction away from the active region, and the non-antenna projection region is a region within the third sub-edge region of the edge region other than the antenna projection region; and an overlapping area between the edge ground traces and the antenna projection region is smaller than an overlapping area between the edge ground traces and the non-antenna projection region.

2. The display panel according to claim 1, wherein a proportion of the overlapping area between the edge ground traces and the antenna projection region in the antenna projection region is less than or equal to 7%.

3. The display panel according to claim 1, wherein a portion of the edge ground traces located on a side of the antenna projection region close to the active region are first traces, and a portion of the edge ground traces located on a side of the non-antenna projection region close to the active region are second traces; and a distance between an edge of a side of the first traces close to the active region and an edge of the base substrate is greater than a distance between an edge of a side of the second traces close to the active region and the edge of the base substrate.

4. The display panel according to claim 1, wherein the edge ground traces comprise an outer ring trace, an inner ring trace, and a plurality of first connection traces; the plurality of first connection traces are connected to the inner ring trace and the outer ring trace; the outer ring trace is located on a side of the inner ring trace away from the active region; and the plurality of first connection traces are located in the non-antenna projection region.

5. The display panel according to claim 4, wherein the inner ring trace comprises at least two inner ring trace segments and an inner ring connection segment connected to adjacent inner ring trace segments; and a distance between the inner ring connection segment and the edge of the base substrate is larger than a distance between an inner ring trace segment and the edge of the base substrate.

6. The display panel according to claim 5, wherein the inner ring trace is not overlapped with the antenna projection region, and the inner ring connection segment of the inner ring trace is located on a side of the antenna projection region close to the active region.

7. The display panel according to claim 4, wherein the inner ring trace is provided with a plurality of first openings, which are arranged in at least one column along a direction from the active region toward the edge region.

8. The display panel according to claim 5, wherein the outer ring trace is not overlapped with the antenna projection region, and the outer ring trace at least comprises two outer ring trace segments located in the non-antenna projection region; or the outer ring trace comprises: at least two outer ring trace segments and an outer ring connection segment connected to adjacent outer ring trace segments; the at least two outer ring trace segments are located in the non-antenna projection region; and a distance between the outer ring connection segment and the edge of the base substrate is larger than a distance between an outer ring trace segment and the edge of the base substrate.

9. The display panel according to claim 8, wherein a width of the outer ring connection segment of the outer ring trace is smaller than a width of the outer ring trace segment; or a width of the outer ring connection segment of the outer ring trace is substantially the same as a width of the inner ring connection segment of the inner ring trace; or the outer ring connection segment of the outer ring trace is located on a side of the antenna projection region close to the inner ring trace; or the outer ring connection segment of the outer ring trace is at least partially overlapped with the antenna projection region.

10. The display panel according to claim 9, wherein the outer ring connection segment is provided with a plurality of second openings, which are arranged in at least one column along a direction from the active region towards the edge region.

11. The display panel according to claim 9, wherein the outer ring trace further comprises a plurality of outer ring extension segments, which are connected to a side of the outer ring connection segment close to the edge of the base substrate, respectively, and extend to the edge of the base substrate; and the plurality of outer ring extension segments are at least partially overlapped with the antenna projection region; and an orthographic projection of at least one outer ring extension segment of the plurality of outer ring extension segments on the base substrate is rectangular or T-shaped.

12. The display panel according to claim 8, wherein the outer ring trace further comprises: at least one second connection trace; the outer ring connection segment of the outer ring trace is connected to the inner ring connection segment of the inner ring trace through the at least one second connection trace; and a resistance of a second connection trace is substantially the same as a resistance of a first connection trace; and an orthographic projection of the first connection traces and the second connection traces on the base substrate is zigzag traces.

13. The display panel according to claim 8, wherein a plurality of anti-static capacitors are arranged between the outer ring trace segments of the outer ring trace and the inner ring trace segments of the adjacent inner ring trace, and at least one anti-static capacitor comprises a first plate and a second plate, wherein the first plate and an outer ring trace segment are of an integral structure, and the second plate is located on a side of the first plate close to the inner ring trace segments.

14. The display panel according to claim 13, wherein the first plate has a plurality of first comb portions facing the second plate, and the second plate has a plurality of second comb portions facing the first plate, and the plurality of first comb portions and the plurality of second comb portions are interspersed with each other; or the first plate of the at least one anti-static capacitor is grounded, and the second plate is a dummy conductive structure; or the touch structure layer comprises at least one touch conductive layer, and a second touch insulation layer located on a side of the at least one touch conductive layer away from the base substrate, and an edge of the second touch insulation layer is overlapped with the anti-static capacitors.

15. The display panel according to claim 1, wherein the touch structure layer comprises: at least one touch conductive layer; and the edge ground traces and the touch conductive layer are disposed in a same layer; and the at least one touch conductive layer comprises a touch trace, and the edge ground traces are located on a side of the touch trace away from the active region.

16. The display panel according to claim 1, wherein the touch structure layer comprises a first touch conductive layer, a second touch conductive layer, and a first touch insulation layer located between the first touch conductive layer and the second touch conductive layer, and a boundary of the first touch insulation layer is located on a side of the edge ground traces close to the active region.

17. The display panel according to claim 1, wherein the edge of the base substrate is flush with an edge of the edge ground traces in the edge region.

18. A display device, comprising the display panel according to claim 1 and an antenna structure, wherein the antenna structure is located on a side of a base substrate of the display panel away from the touch structure layer, and an antenna projection region of the display panel is overlapped with an orthographic projection of the antenna structure on the display panel.

19. A display device, comprising: a display panel and an antenna structure, wherein the antenna structure comprises an active region, and an edge region located on at least one side of the active region, and the edge region comprises an antenna projection region and a non-antenna projection region located on at least one side of the antenna projection region; the active region of the display panel comprises a base substrate, and a display structure layer and a touch structure layer arranged on the base substrate sequentially; the edge region comprises: a touch lead and edge ground traces arranged on the base substrate; the edge ground traces are located on a side of the touch lead away from the active region; the touch lead and the edge ground traces are at least partially arranged in a same layer, wherein the edge region comprises a first sub-edge region, a second sub-edge region and a third sub-edge region along a direction away from the active region, and the non-antenna projection region is a region within the third sub-edge region of the edge region other than the antenna projection region; and an orthographic projection of the antenna structure on the display panel is overlapped with the antenna projection region of the display panel; and an overlapping area between the edge ground traces and the antenna projection region is smaller than an overlapping area between the edge ground traces and the non-antenna projection region.

20. The display device according to claim 19, wherein the antenna structure is located on a side of the base substrate of the display panel away from the touch structure layer; or wherein a portion of the edge ground traces located on a side of the antenna projection region close to the active region are first traces, and a portion of the edge ground traces located on a side of the non-antenna projection region close to the active region are second traces; and a distance between an edge of a side of the first traces close to the active region and an edge of the base substrate is greater than a distance between an edge of a side of the second traces close to the active region and the edge of the base substrate.

* * * * *